(12) United States Patent
Verma et al.

(10) Patent No.: US 8,874,382 B2
(45) Date of Patent: Oct. 28, 2014

(54) METHODS AND SYSTEMS FOR OPTIMIZING CARBON DIOXIDE SEQUESTRATION OPERATIONS

(75) Inventors: Sandeep Verma, Acton, MA (US); Charles S. Oakes, Cambridge, MA (US); Terizhandur S. Ramakrishnan, Boxborough, MA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 1201 days.

(21) Appl. No.: 12/771,751

(22) Filed: Apr. 30, 2010

(65) Prior Publication Data
US 2010/0287123 A1     Nov. 11, 2010

Related U.S. Application Data

(60) Provisional application No. 61/174,821, filed on May 1, 2009.

(51) Int. Cl.
| | |
|---|---|
| *F01D 1/08* | (2006.01) |
| *F17D 1/00* | (2006.01) |
| *F17D 3/01* | (2006.01) |
| *F17D 1/04* | (2006.01) |
| *G06Q 99/00* | (2006.01) |

(52) U.S. Cl.
CPC *F17D 1/04* (2013.01); *F17D 1/005* (2013.01); *B01D 2257/504* (2013.01); *F17D 3/01* (2013.01); *G06Q 99/00* (2013.01)
USPC .......................................................... 702/25

(58) Field of Classification Search
CPC ............ F17D 1/082; F17D 1/005; F17D 3/01
USPC ........................... 62/50.7, 389; 137/7; 702/25
See application file for complete search history.

(56) References Cited

U.S. PATENT DOCUMENTS 3,659,960 A * 5/1972 Dunlop ........................... 417/53
4,345,463 A * 8/1982 Wilson et al. ................... 374/36
(Continued)

FOREIGN PATENT DOCUMENTS

| EA | 006724 | 4/2006 |
|---|---|---|
| EA | 007084 | 6/2006 |
| RU | 2257477 | 7/2005 |
| WO | 9910692 A1 | 3/1999 |

OTHER PUBLICATIONS

Kunz, "The GERG-2004 Wide-Range Equation of State for Natural Gases and Other Mixtures" GERG, 2007, pp. 4, 39-40, 43-44, 105-116 http://www.gerg.eu/publications/tm/tm15_04.pdf.*

(Continued)

*Primary Examiner* — Jonathan C Teixeira Moffat
*Assistant Examiner* — Regis Betsch
(74) *Attorney, Agent, or Firm* — Jakub M. Michna; Bridget Laffey

(57) ABSTRACT

Methods and systems are provided for controlling operational parameters of a $CO_2$ compression surface facility or pipeline in order to maintain a $CO_2$ stream having impurities flowing in the pipeline in a liquid or supercritical phase. Sensors may be provided to sense whether the flow is single-phase or two-phase flow, and feedback provided to adjust the pressure and/or temperature at the pipeline inlet. The system is preferably optimized to limit power consumption and/or cost.

15 Claims, 15 Drawing Sheets

DETAILS OF THE PIPELINE LAYOUT USED IN PRESSURE DROP CALCULATIONS

(56) References Cited

U.S. PATENT DOCUMENTS

| | | | |
|---|---|---|---|
| 4,726,219 A * | 2/1988 | Pearson et al. | 73/54.04 |
| 4,835,687 A | 5/1989 | Martin | |
| 6,201,163 B1 | 3/2001 | Morris et al. | |
| 6,564,578 B1 | 5/2003 | Fischer-Calderon | |
| 6,701,223 B1 | 3/2004 | Rachford, Jr. et al. | |
| 6,918,253 B2 | 7/2005 | Fassbender | |
| 7,493,779 B2 | 2/2009 | Amin | |
| 2001/0007915 A1 | 7/2001 | Morris et al. | |
| 2004/0261505 A1 * | 12/2004 | Di Lullo et al. | 73/49.5 |
| 2005/0155379 A1 * | 7/2005 | Gershtein et al. | 62/617 |
| 2005/0283276 A1 * | 12/2005 | Prescott et al. | 700/282 |
| 2006/0009881 A1 * | 1/2006 | Ferber et al. | 700/282 |
| 2006/0254287 A1 | 11/2006 | Greenberg et al. | |
| 2007/0260333 A1 | 11/2007 | Peureaux et al. | |
| 2008/0078447 A1 | 4/2008 | Sarigiannidis et al. | |
| 2012/0090838 A1 * | 4/2012 | Collins et al. | 166/266 |

OTHER PUBLICATIONS

Van Konynenburg, P. H., Scott, R. L., "Critical Lines and Phase Equilibria in Binary van der Waals Mixtures," Philosophical Transactions of the Royal Society of London, Series A, Mathematical, Physical, and Engineering Sciences, Dec. 1980, vol. 298(1442): pp. 495-540.

Perry, R. H., and Green, D., "Perry's Chemical Engineers' Handbook," 6th Edition, 1984, McGraw-Hill Professional Publishing: p. 5-24.

Sandler, S. I., "Chapter 8.2: Vapor-Liquid Equilibria Using Equations of State," Chemical and Engineering Thermodynamics, New York: John Wiley & Sons, 1999: pp. 518-522.

Kunz, O., Klimeck, R., Wagner, W., and Jaeschke, M., "GERG TM15: The GERG-2004 Wide-Range Equation of State for Natural Gases and Other Mixtures," VDI Verlag GmbH, Dusseldorf: Publishing House of the Association of German Engineers, 2007: pp. 1-535.

International Search Report of PCT Application No. PCT/US2010/033238 dated Aug. 2, 2010: pp. 1-3.

Grant Notice of Russian Application No. 2011148939 dated Jul. 17, 2014: pp. 1-6.

Examination Report of Canadian Application No. 2,753,410 dated Aug. 5, 2014: pp. 1-3.

McCoy et al., "An engineering-economic model of pipeline transport of CO2 with application to carbon capture and storage," International Journal of Greenhouse Gas Control, vol. 2(2), 2008: pp. 219-229.

* cited by examiner

CO$_2$–O$_2$ PHASE DIAGRAM (IDEAL MIXING MODEL)

CO$_2$–Ar PHASE DIAGRAM $CO_2-N_2$ PHASE DIAGRAM

12" PIPELINE, 4% OXYGEN, 60°F, 1211 psia

OXYFUEL COMBUSTION POWER PLANT

DETAILS OF THE PIPELINE LAYOUT USED IN PRESSURE DROP CALCULATIONS

METHODS AND SYSTEMS FOR OPTIMIZING CARBON DIOXIDE SEQUESTRATION OPERATIONS

RELATED APPLICATION

The present application claims priority from provisional U.S. Ser. No. 61/174,821 filed on May 1, 2009, the complete disclosure of which is hereby incorporated by reference herein.

FIELD OF THE INVENTION

This invention relates broadly to methods and systems for optimizing carbon dioxide sequestration operations. More particularly, this invention relates to methods and systems for designing, controlling or monitoring operational parameters of a carbon dioxide ($CO_2$) compression surface facility or pipeline in order to maintain said $CO_2$ within a liquid or supercritical state during transport to a sequestration site.

BACKGROUND OF THE INVENTION

Carbon dioxide ($CO_2$) geological storage is one of the approaches considered for stabilizing atmospheric $CO_2$ concentrations. Captured $CO_2$ from a source such as effluent from a coal-fired power plant is injected through a well into the subsurface, e.g. saline aquifers. Once injected, $CO_2$ is expected to be confined by overlying and underlying impermeable layers in the reservoir, enabling long-term (thousands of years) storage whether the stored form is as a separate CO2-rich phase or in the form of carbonate minerals or as dissolved solute.

In order to sequester carbon dioxide exiting a power plant into underground reservoirs, it is necessary to separate the carbon dioxide from the flue gas, and compress it before pumping it underground into the reservoir. The separation and compression steps typically entail a 15-30% penalty in the net power delivered by the power plant. In addition, the purity levels for the sequestered $CO_2$ may be required by legislation to be 99+% which would entail prohibitive power penalties. Conversely, in order to improve power plant efficiencies, it may be necessary to accept contaminant components in excess of 1% (by mole) in the $CO_2$ flow stream.

It has been shown that changes in fluid composition may affect the design and operation of surface facilities and pipeline networks to deliver the gas at certain fixed wellhead conditions for injection. U.S. Pat. Nos. 4,835,687 and 6,701,223 and patent publication US2007/0260333 relate to the monitoring and computational control of pipeline parameters for power optimization in natural gas streams. U.S. Pat. No. 6,201,163 and patent publication US2001/0007915 relate to the addition of less compressible but miscible hydrocarbons to natural gas streams in order to lower pipeline compression power consumption. Patent publication US2006/0254287 relates to optimization within methane-rich natural gas systems.

Standard equations for calculation of pressure drop in pipelines for single-phase flow are given below. For compressor calculations, the work done for adiabatic (or isoentropic) compression is divided by an efficiency factor. The power required to compress gases is given by the following formula:

$$W_{ad} = 2.78 \cdot 10^{-4} \frac{k}{k-1} \frac{WRT_1}{9806} \left[ \left(\frac{P_2}{P_1}\right)^{\frac{k-1}{k}} - 1 \right] \quad (1)$$

where $W_{ad}$ is power in kW, W is mass flow rate in kg/s, R is the universal gas constant (J/kg/K), $T_1$ is the upstream temperature (K), $P_1$ is the absolute upstream pressure (kPa), $P_2$ is the absolute downstream pressure, and k is the ratio of specific heats for the gas ($C_p/C_v$). To calculate the actual power used in compression, $W_{ad}$ is divided by an efficiency factor (~0.7). The downstream temperature is calculated by the following relationship for ideal gases:

$$\frac{T_2}{T_1} = \left(\frac{P_2}{P_1}\right)^{\frac{k}{k-1}} \quad (2)$$

With respect to heat exchanger calculations, the aftercooler, intercooler and the heater/cooler in a surface facility may either be air cooled, water cooled or refrigerant cooled. If the gas stream needs to be heated, the heat may be obtained from steam, electric power, combustion of a suitable fuel, or waste heat from a process. The energy exchanged may be calculated from the following equation:

$$Q = W(h_2 - h_1) \approx WC_p(T_2 - T_1) \quad (3)$$

where Q is the heat exchanged, $h_i$ is the enthalpy of the gaseous stream and $C_p$ is the specific heat (at constant pressure) of the gas.

With respect to pipe flow calculations, there are three equations that need to be solved simultaneously. The first is the mass conservation or the continuity equation, the second is the momentum balance and the third is the energy balance:

$$\frac{\partial(A\rho)}{\partial t} + \frac{\partial(\rho u)}{\partial x} = 0 \quad (4)$$

$$\frac{\partial(\rho u)}{\partial t} + \frac{\partial(\rho u^2 + p)}{\partial x} = \rho g \sin\theta - \frac{1}{2} f \rho u |u| \frac{S}{A} - \rho u^2 \frac{1}{A} \frac{dA}{dx} \quad (5)$$

$$\frac{\partial(\rho E)}{\partial t} + \frac{\partial(\rho H u)}{\partial x} = k_T(T_{wall} - T)\frac{S}{A} - \rho g \sin\theta - \frac{1}{2} f \rho u |u| \frac{S}{A} - \rho H u \frac{1}{A} \frac{dA}{dx} \quad (6)$$

where A is the pipe cross sectional area given by $A = 0.25\pi D^2$, E is the internal and kinetic energy given by $E = e + 0.5u^2$, H is the enthalpy and kinetic energy given by $H = h + 0.5u^2$, S is the pipe perimeter given by $S = \pi D$, D is the pipe diameter, e is the internal energy, f is the Fanning friction factor (see Page 5-24, Chemical Engineers Handbook, $6^{th}$ edition), g is the acceleration due to gravity, h is the enthalpy, $k_T$ is the heat transfer coefficient, p is the pressure, t is time, T is the temperature, $T_{wall}$ is i the wall temperature, u is the average fluid velocity, x is the distance along the pipe, $\theta$ is the pipe inclination with respect to the horizontal, and $\rho$ is the density.

SUMMARY OF THE INVENTION

According to one aspect of the present invention, a method is provided for controlling operational parameters of a $CO_2$ compression surface facility or pipeline in order to maintain the primarily $CO_2$ stream flowing in the pipeline in a liquid or supercritical state. According to one embodiment, a method for avoiding a liquid/gas two-phase flow in the pipeline includes determining the fluid composition flowing in the pipeline, generating a phase analysis (e.g., a phase diagram) of the fluid composition, and based on the phase analysis, controlling the operational parameters accordingly to ensure that a liquid/gas two-phase flow in the pipeline is avoided. The primary operational parameters that are controlled are the pressure and temperature at which the fluid enters the pipeline, although in some instances, when a network of different effluent fluid sources is available, it may be possible to modify the makeup of the effluent fluid. The method recognizes that impurities in the carbon dioxide stream change the phase behavior and fluid transport properties of the carbon dioxide effluent and that a variation of contaminant levels in the flow stream under an identical inlet pressure and temperature scenario may lead to the formation of two-phase flow within the pipeline. Two-phase flow in turn leads to a higher pressure drop, further promoting a higher vapor fraction formation downstream; an undesirable positive feedback mechanism.

Advantageously, systems corresponding to the methods of the invention are provided. One system includes fluid composition sensors, compressors, heat exchangers, and a control system. The fluid composition sensors, compressors and heat exchangers are preferably located at the pipeline inlet. The control system receives information from the fluid composition sensors, generates a phase analysis of the fluid composition, and controls the compressors and/or heat exchangers such that the effluent (primarily carbon dioxide) fluid is compressed and at a proper temperature to ensure that the effluent remains in a liquid or supercritical phase throughout the pipeline.

Advantageously, one embodiment of the method of the invention comprises designing pipelines to optimize overall cost of installation and operation for a range of flue gas compositions.

Advantageously, one embodiment of the method of the invention comprises analysing the expected pipeline outlet fluid composition and generating an operational specification at the pipeline outlet for that given fluid composition so as to maintain $CO_2$ within a liquid or supercritical phase stream in the pipeline.

Advantageously, one embodiment of the method of the invention comprises real-time compositional analysis of the outlet fluid composition, generation of a multi-component phase diagram of the outlet fluid composition based on equations of state, and automatic adjustment of pressure and/or temperature at a compressor-cooler outlet of the surface facility in order to maintain a liquid or supercritical phase stream flow throughout the pipeline.

Advantageously, in one embodiment of the system and method of the invention, the pressure at the pipeline input is controlled to be between 0% and 30% above a pressure which is determined to be the minimum pressure required to maintain a liquid or supercritical phase stream flow throughout the pipeline.

According to another embodiment of the system and method of the invention, sensors are placed at the outlet of the pipeline adjacent the sequestration well to determine the phase of the flow stream at the outlet, and the information obtained by the sensors is used by a controller coupled to and controlling the compressors and/or heat exchangers at the pipeline inlet in order to tune the compressors and/or heat exchangers to cause the flow stream to be maintained in a liquid or supercritical phase throughout the pipeline.

According to another embodiment of the system and method of the invention, pressure and temperature are measured at several points along the pipeline. These measured values are calibrated against each other and against references, and during flowing conditions are used to identify sharp changes in gradients. Sharp gradients in either the pressure or temperature measurements (or in conjunction with each other) indicate a phase change or creation or a vapor phase. This measurement is then used to adjust the inlet pressure and temperature to the pipeline or at various locations along the pipeline to eliminate these gradients.

Advantageously, in one embodiment of the method of the invention optimizing $CO_2$ sequestration operations includes minimizing the overall cost of compression and/or the procurement of pure $CO_2$ for diluting $CO_2$ contaminants.

BRIEF DESCRIPTION OF THE FIGURES

The present invention is further described in the detailed description which follows, in reference to the noted plurality of drawings by way of non-limiting examples of exemplary embodiments of the present invention, in which like reference numerals represent similar parts throughout the several views of the drawings, and wherein.

It will be recognized by the person of ordinary skill in the art, given the benefit of this disclosure, that certain dimensions, features, components, and the like in the figures may have been enlarged, distorted or otherwise shown in a nonproportional or non-conventional manner to facilitate a better understanding of the technology disclosed herein.

DETAILED DESCRIPTION OF THE INVENTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, systems, processes, and other elements in the invention may be shown as components in block diagram form in order not to obscure the embodiments in unnecessary detail. In other instances, well-known processes, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Figure 1:
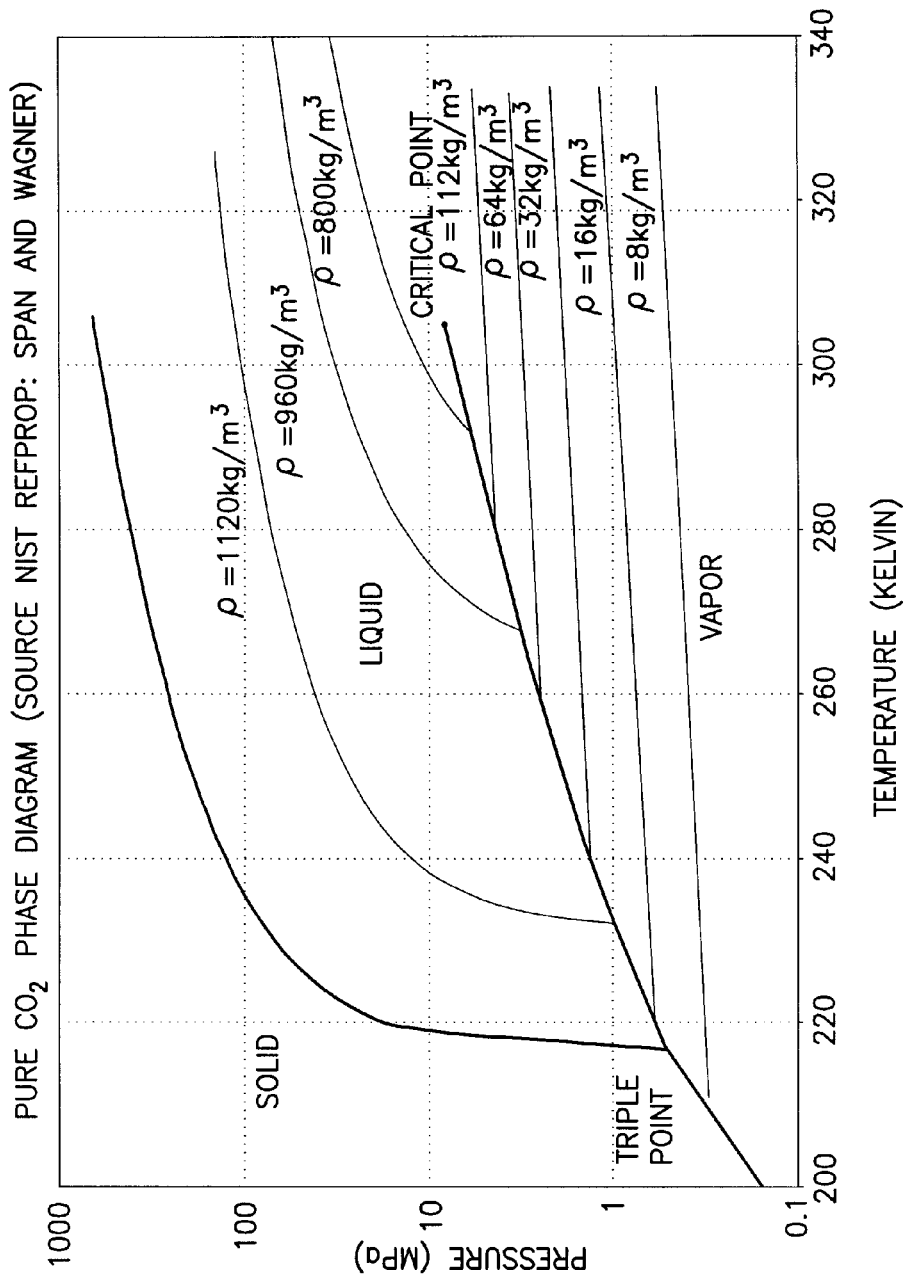
FIG. 1 represents a pure $CO_2$ phase diagram.

A phase diagram for pure carbon dioxide is shown in FIG. 1. The critical point is at 7.38 MPa and 31.1° C. For purposes herein, if the operating pipeline conditions are such that the temperature is higher than 31.1° C. (304.2 K) and the pressure is higher than 7.38 MPa, then $CO_2$ is said to exist in a supercritical state. In the supercritical state, and in the liquid state (above the vapor-liquid line shown in FIG. 1), the pressure drop in a pipeline is low (as discussed below with reference to FIG. 5). If carbon dioxide exists in a state that is on the two-phase boundary (where both vapor and liquid co-exist), or is a vapor phase (or gas phase) at any point along the pipeline, then the pressure drop is considerably higher (as discussed below with reference to FIG. 7). For a given wellhead pressure, a higher pressure drop translates to a higher outlet pressure from the compressor and therefore a higher power consumption by the compressor. According to one aspect of the invention, it is therefore desirable to design and operate a pipeline such that the carbon dioxide stays as a liquid or a supercritical fluid throughout the length of the pipeline.

Captured or purified carbon dioxide from the flue gas of a power plant contains many chemical components. In Table 1 below, an example of an effluent gas composition from an oxyfuel combustion power plant such as shown in prior art FIG. 14 (discussed below) is presented.

TABLE 1

| Component in Effluent Gas, mol % | Effluent resulting from combustion in 97.5% oxygen | Effluent % resulting from combustion in 95% oxygen |
| --- | --- | --- |
| Oxygen | 1.82% | 1.73% |
| Water | 0.16% | 0.15% |
| Carbon Dioxide | 92.9% | 88.88% |
| Nitrogen | 0.58% | 0.89% |
| Argon | 4.55% | 8.33% |

As shown in Table 1, the effluent gas from an oxyfuel combustion power plant contains three main contaminants, namely nitrogen, oxygen and argon in the carbon dioxide stream. It is assumed that water will be removed to the level of a few 10s to 100s ppm in order to avoid corrosion and flow assurance problems. It should be noted that the effluent purified carbon dioxide stream from other power generation cycles such as a conventional coal fired power plants will contain other higher amounts of additional contaminants such as nitrogen and sulfur oxides. Similarly, effluent gas from an IGCC (Integrated Gasification Combined Cycle) power plant will contain $H_2S$ as a contaminant as the reactions take place in a reducing atmosphere. For a complete analysis of effluent gas from any power generation plant, many additional contaminants need to be considered. For simplicity and to illustrate the approach of the invention, however, much of the following discussion relates to the binary phase diagrams for carbon dioxide with three primary contaminants identified in Table 1. This approach and discussion is relevant to all contaminant gases even though only the addition of oxygen, argon and nitrogen as binary mixtures are described in detail. In addition, and as will be discussed hereinafter, it is possible to generate mixture phase diagrams for carbon dioxide with more than one additional component using the same (or different) equations of state used to generate the binary phase diagrams. Thus, the disclosures relating to the binary phase diagrams are equally applicable to multicomponent mixtures.

Figure 2:
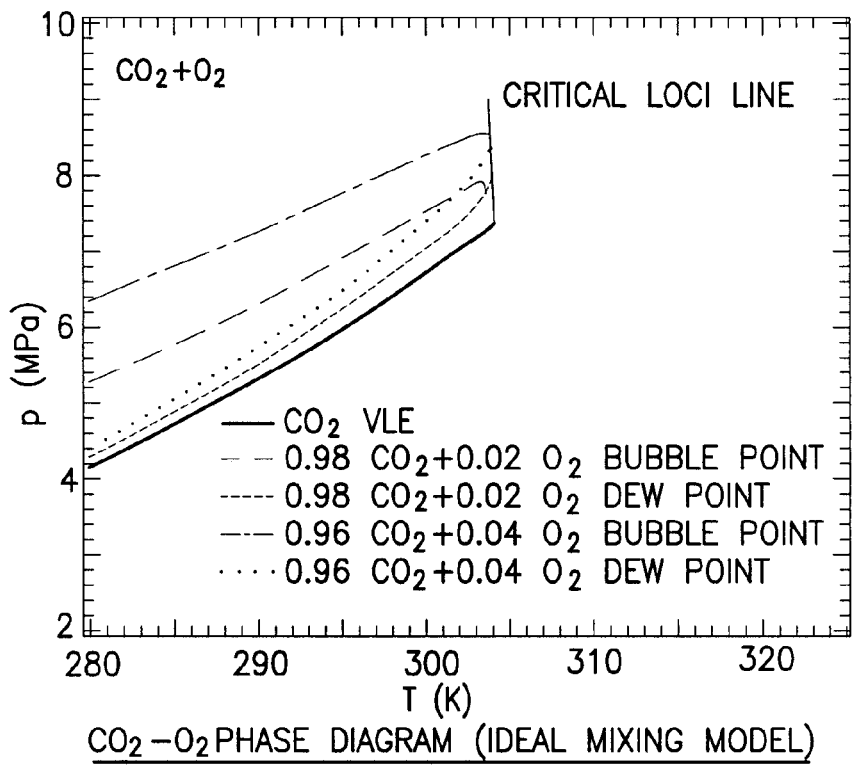
FIG. 2 is a representation of a $CO_2$ and $O_2$ phase diagram.

FIG. 2 shows the phase diagrams for a mixture of 98 mol % $CO_2$ and 2 mol % oxygen, a mixture of 96% mol % $CO_2$ and 4 mol % oxygen, and pure (100%) $CO_2$. As seen in FIG. 2, the critical pressures of both mixtures are higher than the critical pressure of carbon dioxide. Additionally, since this is no longer a single component phase diagram, a two-phase region, as opposed to a two-phase line, is generated. The two-phase region is demarcated by the dew point curve at the bottom and a bubble-point curve at the top. Carbon dioxide and oxygen form a Category I mixture (as discussed hereinafter). The loci of critical points, or the critical loci lie on a line of higher pressure and lower temperature than the pure carbon dioxide critical pressure and temperature. The deviation (from pure carbon dioxide) in the mixture critical pressure and temperature is higher for a larger concentration of oxygen.

Figure 3:
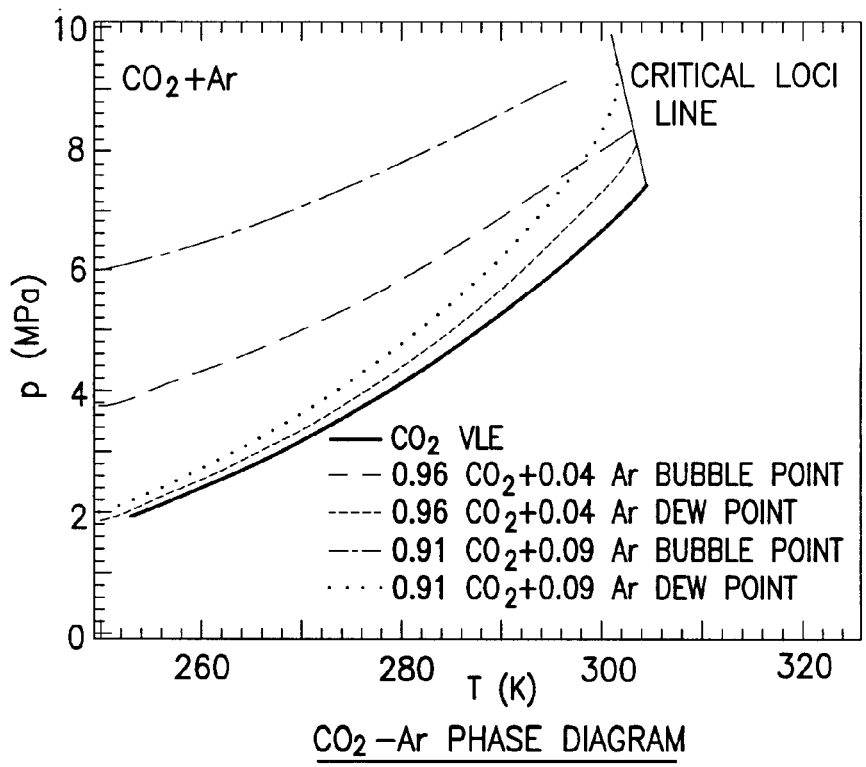
FIG. 3 is a representation of a $CO_2$ and Ar phase diagram.

FIG. 3 shows the phase diagrams for a mixture of 96 mol % $CO_2$ and 4 mol % argon, a mixture of 91% mol % $CO_2$ and 9 mol % argon, and pure (100%) $CO_2$. As seen in FIG. 3, the critical pressures of both mixtures are higher than the critical pressure of carbon dioxide. Additionally, since this is no longer a single component phase diagram, a two-phase region, as opposed to a two-phase line, is generated. The two-phase region is demarcated by the dew point curve at the bottom and a bubble-point curve at the top.

Figure 4:
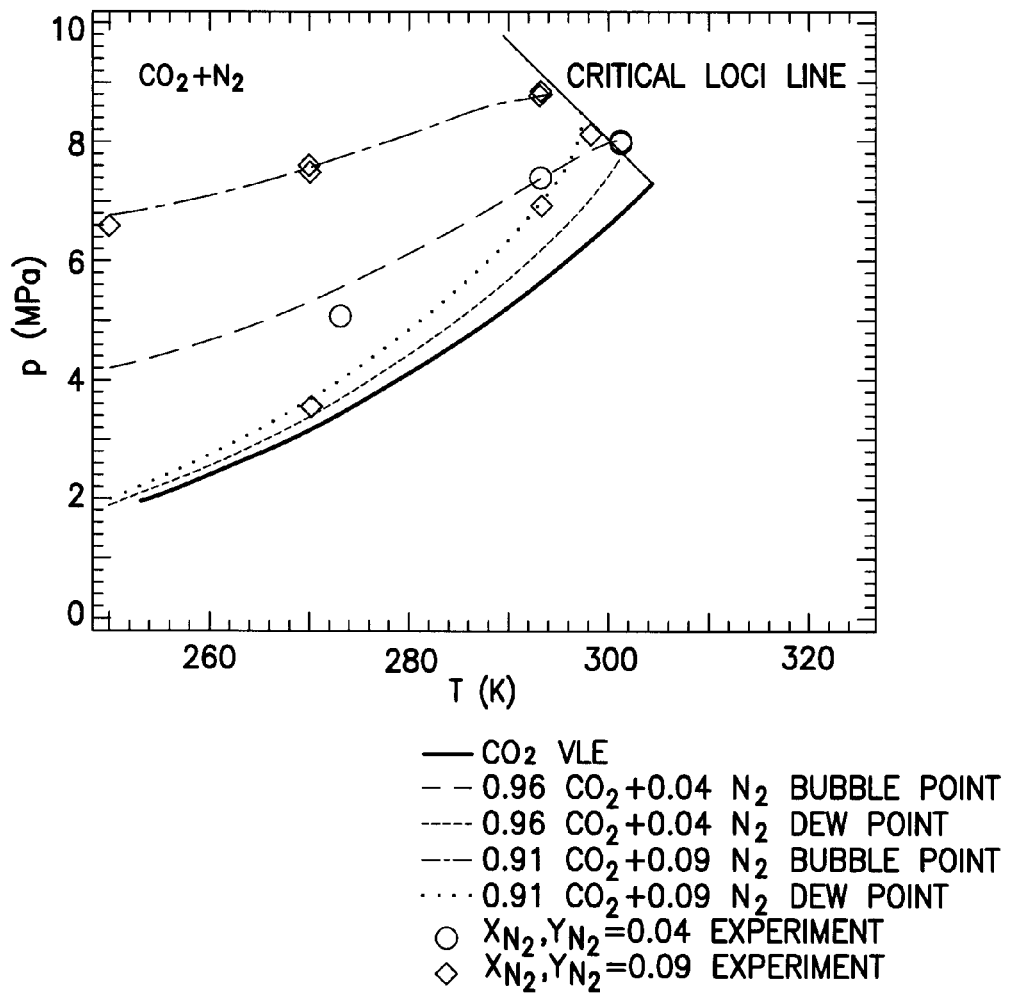
FIG. 4 is a representation of a $CO_2$ and $N_2$ phase diagram.

FIG. 4 shows the phase diagrams for a mixture of 96 mol % $CO_2$ and 4 mol % nitrogen, a mixture of 91% mol % $CO_2$ and 9 mol % nitrogen, and pure (100%) $CO_2$. As seen in FIG. 4, the critical pressures of both mixtures are higher than the critical pressure of carbon dioxide. Additionally, since this is no longer a single component phase diagram, a two-phase region, as opposed to a two-phase line, is generated. The two-phase region is demarcated by the dew point curve at the bottom and a bubble-point curve at the top.

Figure 5:
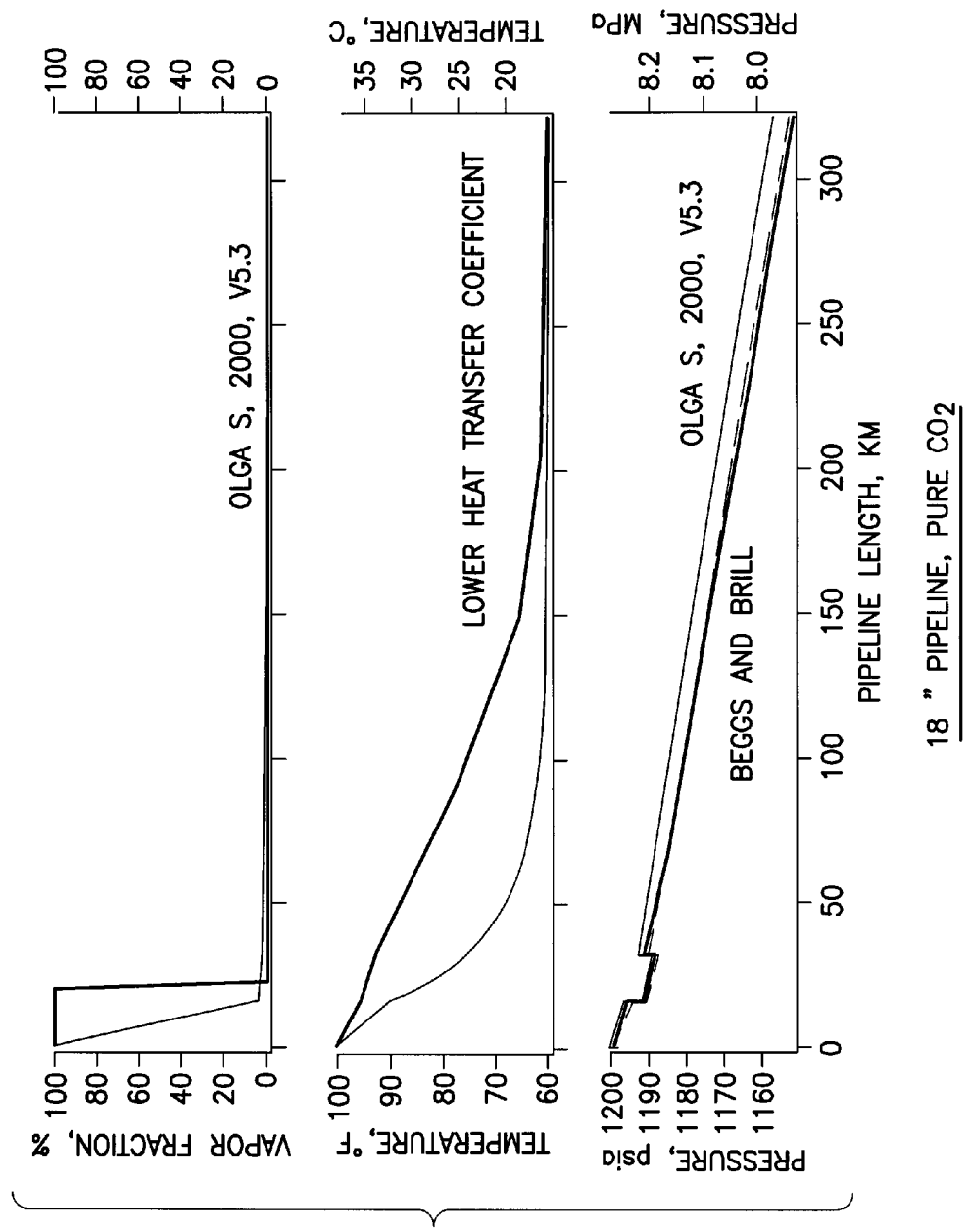
FIG. 5 represents P, T, and vapor fraction in a 18 inch pipeline for pure $CO_2$ in supercritical or liquid state.
Figure 6:
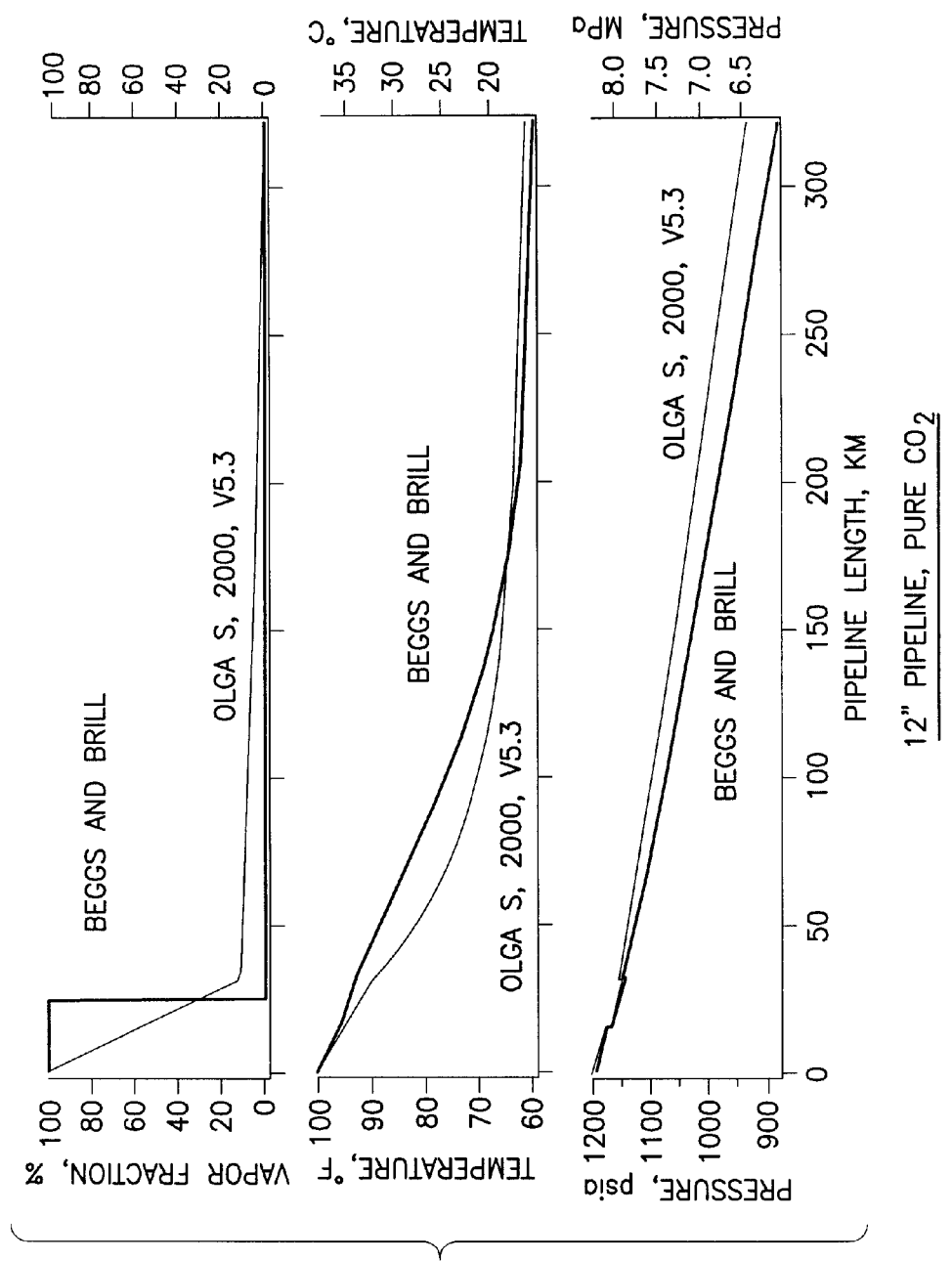
FIG. 6 represents P, T, and vapor fraction in a 12 inch pipeline for pure $CO_2$ in supercritical or liquid state.
Figure 16:
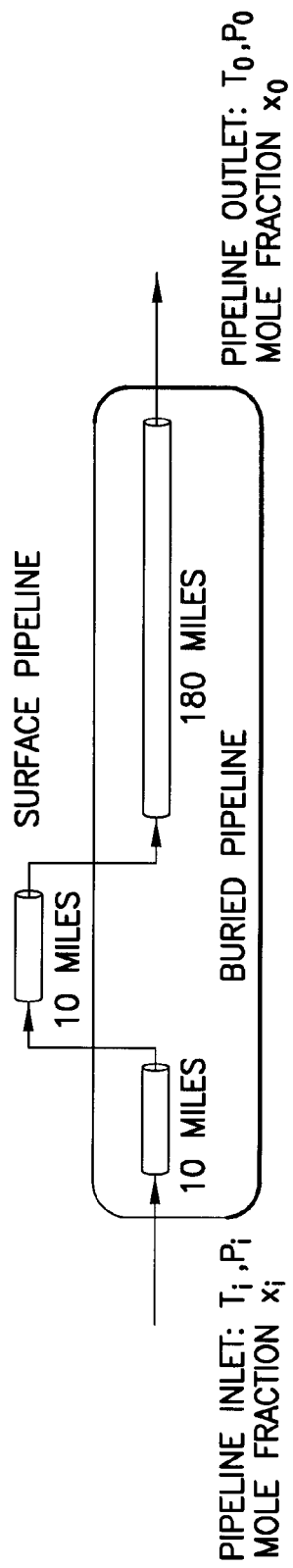
FIG. 16 is a pipeline schematic.

Turning now to FIG. 5, pressure, temperature, and vapor fraction plots based on two different models or correlations (OLGA S, 2000 V5.3; and Beggs and Brill) are shown for an 18 inch pipeline carrying pure $CO_2$. The pipeline is assumed to be 200 miles long, with 10 miles of pipe above ground and 190 miles of buried pipe, and the pipeline is assumed to transport one million tonnes of carbon dioxide per year. The pipeline schematic is shown in FIG. 16. The inlet temperature is taken as 37.7° C. (100° F.), and the ambient temperature is taken as 60° F. As seen in FIG. 5, the temperature of the pure $CO_2$ drops at either a relatively fast rate (OLGA S, 2000 V5.3) or at a relatively slower rate (Beggs and Brill) depending upon the model utilized, but eventually reaches the ambient temperature before the end of the pipeline. The pressure declines from 1200 psia (8.27 MPa) to between 1150 and 1160 psia (between 7.9 and 8.0 MPa)) for Beggs-Brill and OLGA models, respectively. The vapor fraction according to both models, after a distance of approximately 25 miles is zero (i.e., the fluid exists as a single phase liquid). In approximately the first 25 miles, a vapor fraction of 100% represents supercritical fluid as opposed to gas. In addition, it will be appreciated that the single-phase flow results correspond to the phase diagram of FIG. 1 as at all times, the temperature-pressure values for the pipeline are above the vapor-liquid line Plots for a second pipeline of the same length, carrying the same mass flow rate of carbon dioxide and subject to the same temperatures, and otherwise identical except that it has a twelve inch diameter is shown in FIG. 6. As would be expected, because of friction, the pressure drop over the 200 mile pipeline is significantly larger for the twelve inch pipeline than it was for the eighteen inch pipeline. Thus, the pressure drops about 25% from 1200 psia (8.27 MPa) to between about 900 (6.4 MPa) and 950 psia (6.5 MPa) depending upon the model. However, the temperature plots and the vapor fraction plots are similar. As with the case for the example shown in FIG. 5 (and previously described), the path on the Pressure-Temperature phase diagram (or FIG. 1) for the twelve inch diameter pipeline arrangement of FIG. 6 stays above the vapor-liquid line.

Figure 7:
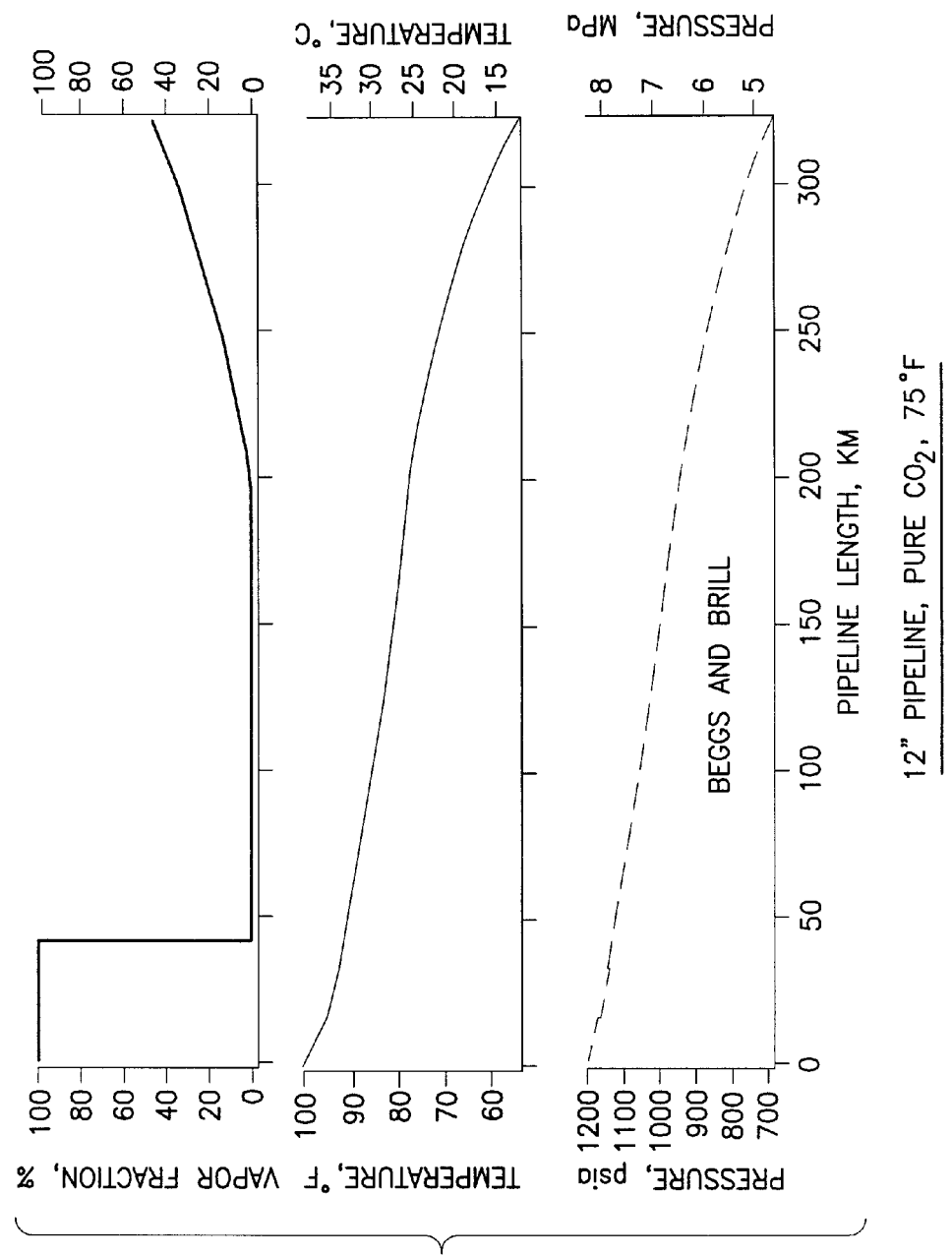
FIG. 7 represents P, T, and vapor fraction in a 12 inch pipeline for pure $CO_2$ with operating pipeline inlet conditions at a temperature of 75° C.

FIG. 7 depicts an identical arrangement to the arrangement of FIG. 6 except that the ambient temperature is taken as 75° F. instead of 60° F. In this case the effect of the temperature change is significant. In particular, at about the 120 mile location (200 km), the fluid in the pipeline enters the two-phase region on the phase diagram (with the creation of a vapor phase), and thereafter, the percentage of gas increases. As a result, the pressure drop from the inlet to the outlet reaches approximately 42% (from 1200 psia to approximately 700 psia). The temperature also drops to about 55° F. at the outlet as the phase change from liquid to vapor conserves energy by reduction of temperature (due to the latent heat of vaporization). As a result, an undesirable condition of low pressure and low temperature are found at the pipeline outlet.

Figure 8:
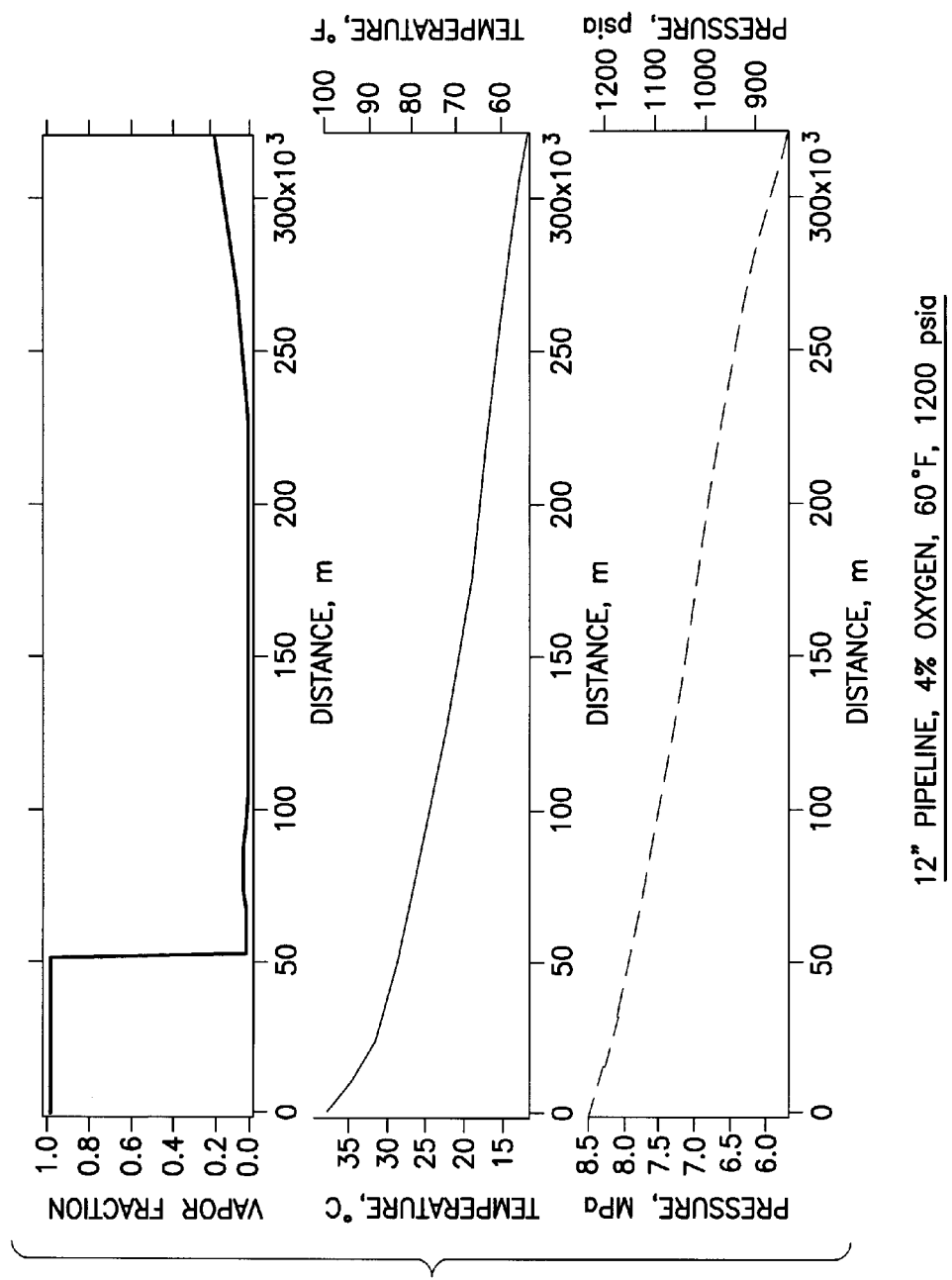
FIG. 8 represents P, T, and vapor fraction in a 12 inch pipeline for a fluid composition containing 4% oxygen with operating pipeline inlet conditions at a temperature of 60° F. and a pressure of 1200 psia.

FIG. 8 depicts an arrangement similar to the arrangement of FIG. 6 except that instead of the pipeline carrying 100% $CO_2$, the pipeline is carrying a mixture of 96% $CO_2$ and 4% $O_2$ and instead of an inlet pressure of 1200 psia, the inlet pressure is 1240 psia (8.43 MPa). FIG. 8 shows a pressure drop in a pipeline of approximately 33% (bottom graph) to about 830 psia, and a temperature drop below ambient to about 55° F. (middle graph) which corresponds to the formation of a vapor phase (top graph) in the last 50 miles of the pipeline. Indeed, at the pipeline outlet, the expectation is a two-phase flow of approximately 80% liquid and 20% vapor. Thus, FIG. 8 likewise depicts undesirable conditions of low pressure and low temperature at the pipeline outlet.

Figure 9:
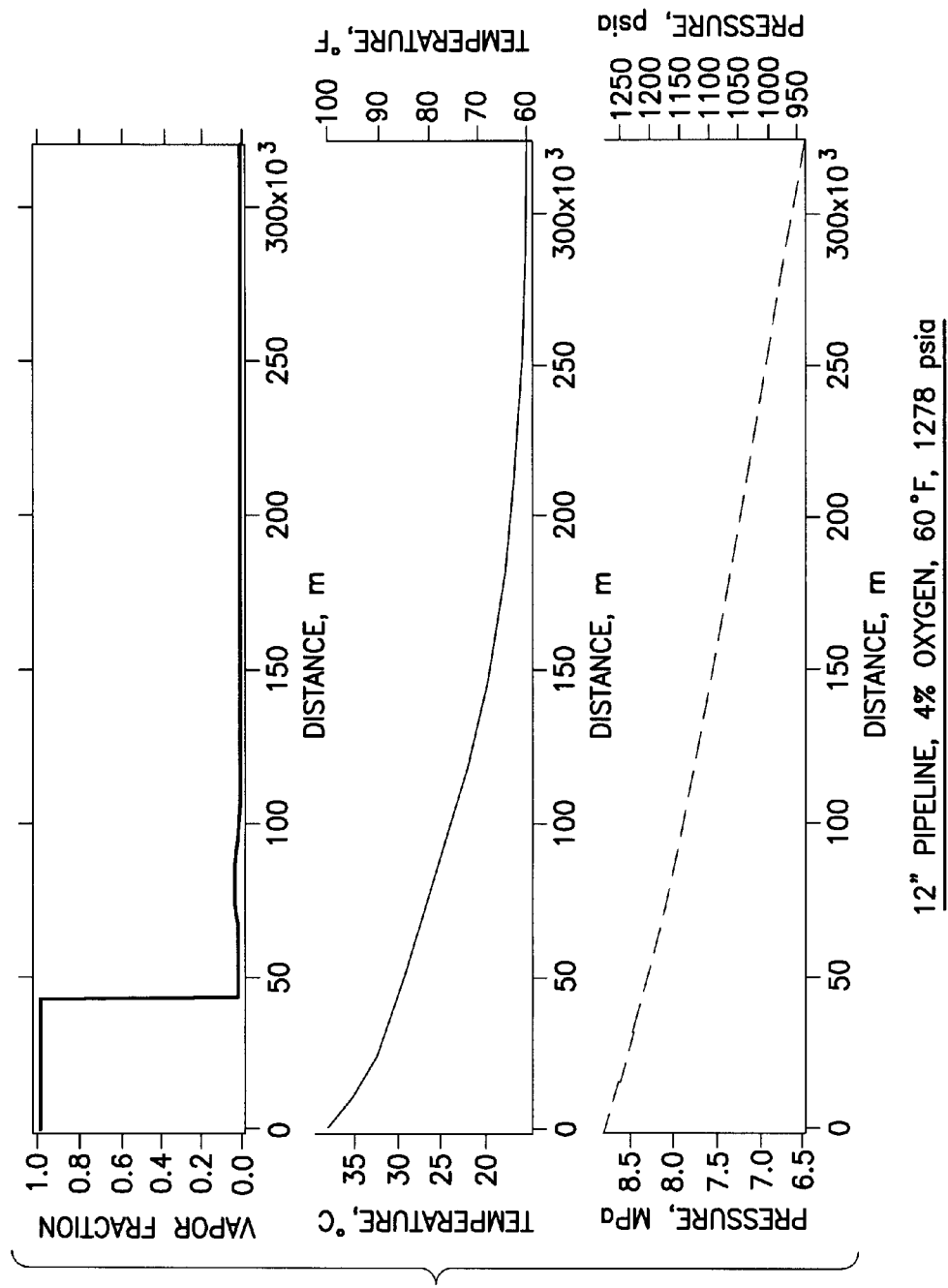
FIG. 9 represents P, T, and vapor fraction in a 12 inch pipeline for a fluid composition containing 4% oxygen with operating pipeline inlet conditions at a temperature of 60° F. and a pressure of 1278 psia.

To overcome the undesirable pipeline outlet conditions, it is possible to increase the inlet pressure to a level such that the pressure-temperature conditions along the pipeline never cross the bubble point curve. Thus, as shown in FIG. 9, if the pressure at the inlet of the pipeline of FIG. 8 is increased from 1240 psia to 1278 psia (everything else being identical), the pressure drop (as a fraction of inlet pressure) is only approximately 26% (as opposed to approximately 33%). The outlet pressure is approximately 950 psia, the pipeline temperature does not drop below ambient, and no vapor forms along the pipeline; i.e., the P, T, conditions along the pipeline will never cross the bubblepoint curve and there will be no two-phase flow. Therefore, by modifying the pipeline inlet conditions for a pipeline of particular characteristics, the frictional pressure drop in the pipeline is reduced and as a result the efficiency of pipeline transport is improved. In this particular pipeline, an increase of the inlet pressure by 38 psia reduces the total pressure drop by about 82 psia (from a drop of 410 psia to a drop of 328 psia). Similar effects are observed for argon and nitrogen and discussed below with reference to FIGS. 10, 11, 12 and 13.

Figure 10:
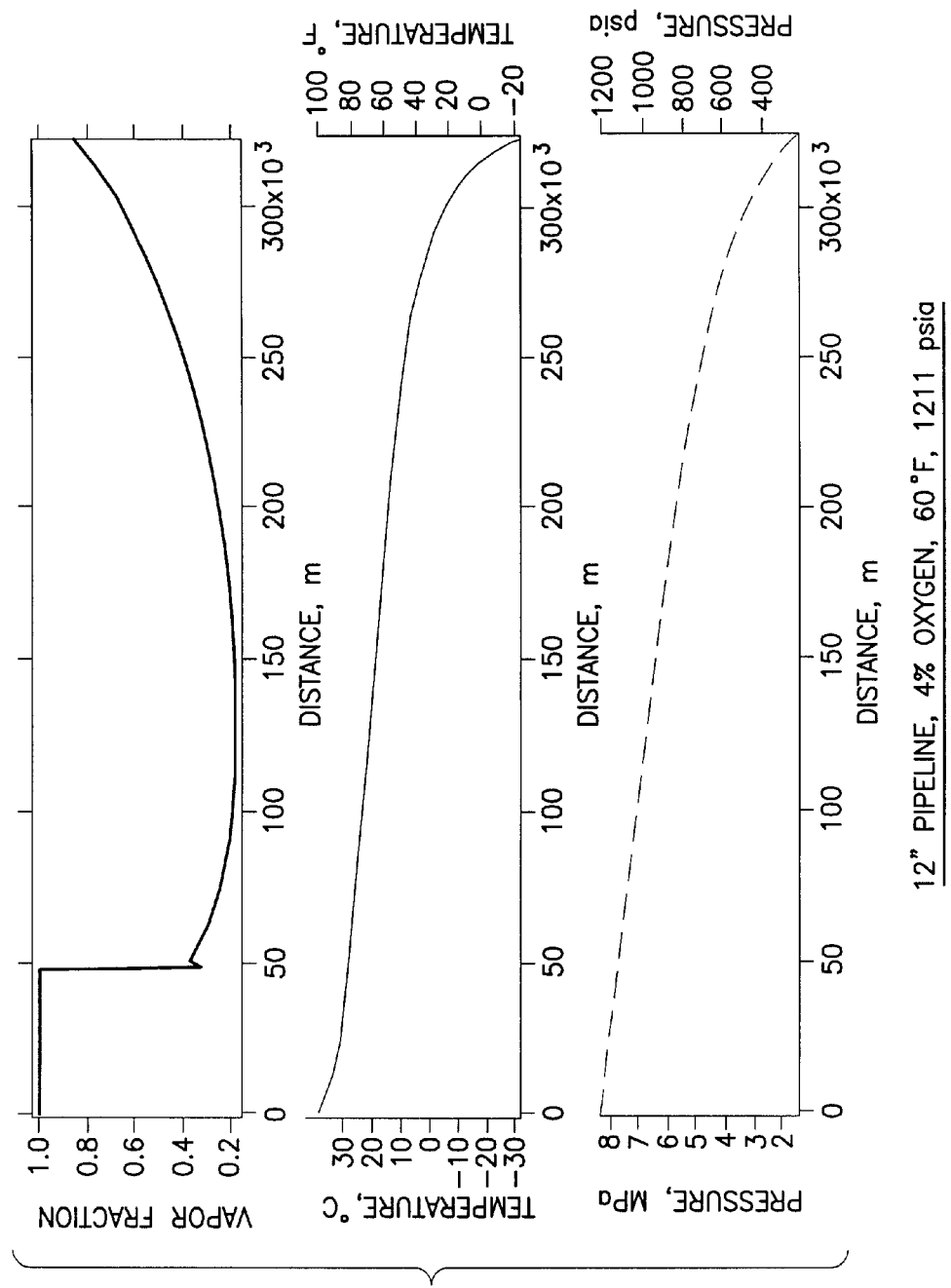
FIG. 10 represents P, T, and vapor fraction in a 12 inch pipeline for a fluid composition containing 4% argon with operating pipeline inlet conditions at a temperature of 60° F. and a pressure of 1211 psia.

FIG. 10 depicts an identical arrangement to the arrangement of FIG. 6 except that instead of the pipeline containing 100% $CO_2$, it contains 96% $CO_2$ and 4% argon, and the inlet pressure is set at 1211 psia (instead of 1200 psia). As indicated by the bottom graph, the pressure loss in this circumstance is very large (over 75% of the inlet pressure), and as indicated by the top graph, once the fluid crosses the bubble point curve, there is two-phase flow along most of the pipeline. In fact, at the outlet, over 80% of the fluid is in the vapor (gas) phase. Due to the latent heat of vaporization, the temperature of the fluid drops significantly below ambient to −20° F. Thus, extremely undesirable conditions are found at the pipeline output.

Figure 11:
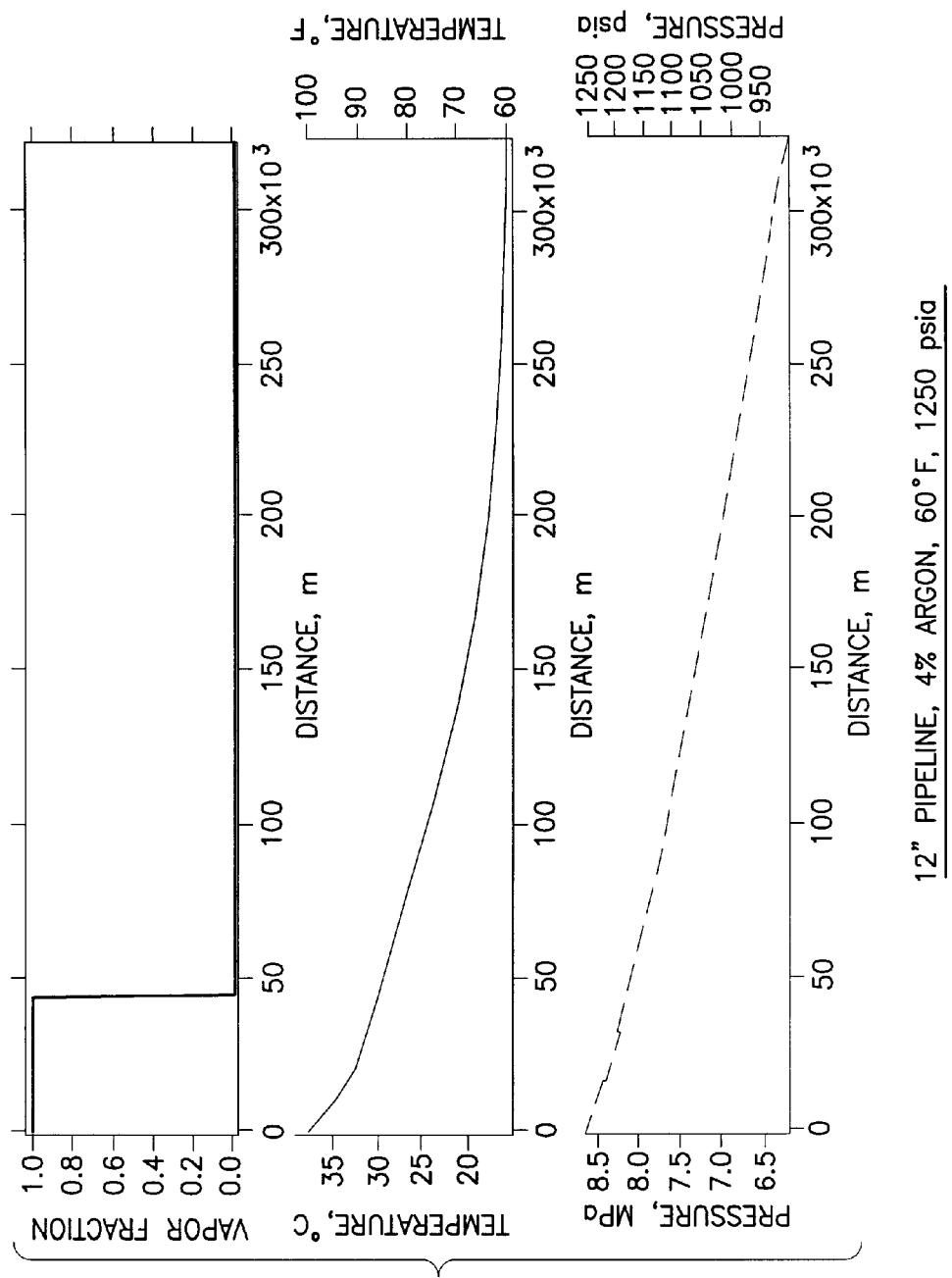
FIG. 11 represents P, T, and vapor fraction in a 12 inch pipeline for a fluid composition containing 4% argon with operating pipeline inlet conditions at a temperature of 60° F. and a pressure of 1250 psia.

FIG. 11 depicts an identical arrangement to the arrangement of FIG. 10, except that the inlet pressure is increased to 1250 psia. As a result, as seen in the top graph, single-phase flow is maintained along the entire length of the pipeline. In addition, the pressure drop is reduced from over 75% to about 28% of the inlet pressure, and the temperature of the fluid never drops below ambient. Thus, increasing the inlet pressure by a small amount, power consumption in the compressor is reduced, and desired outlet conditions are obtained.

Figure 12:
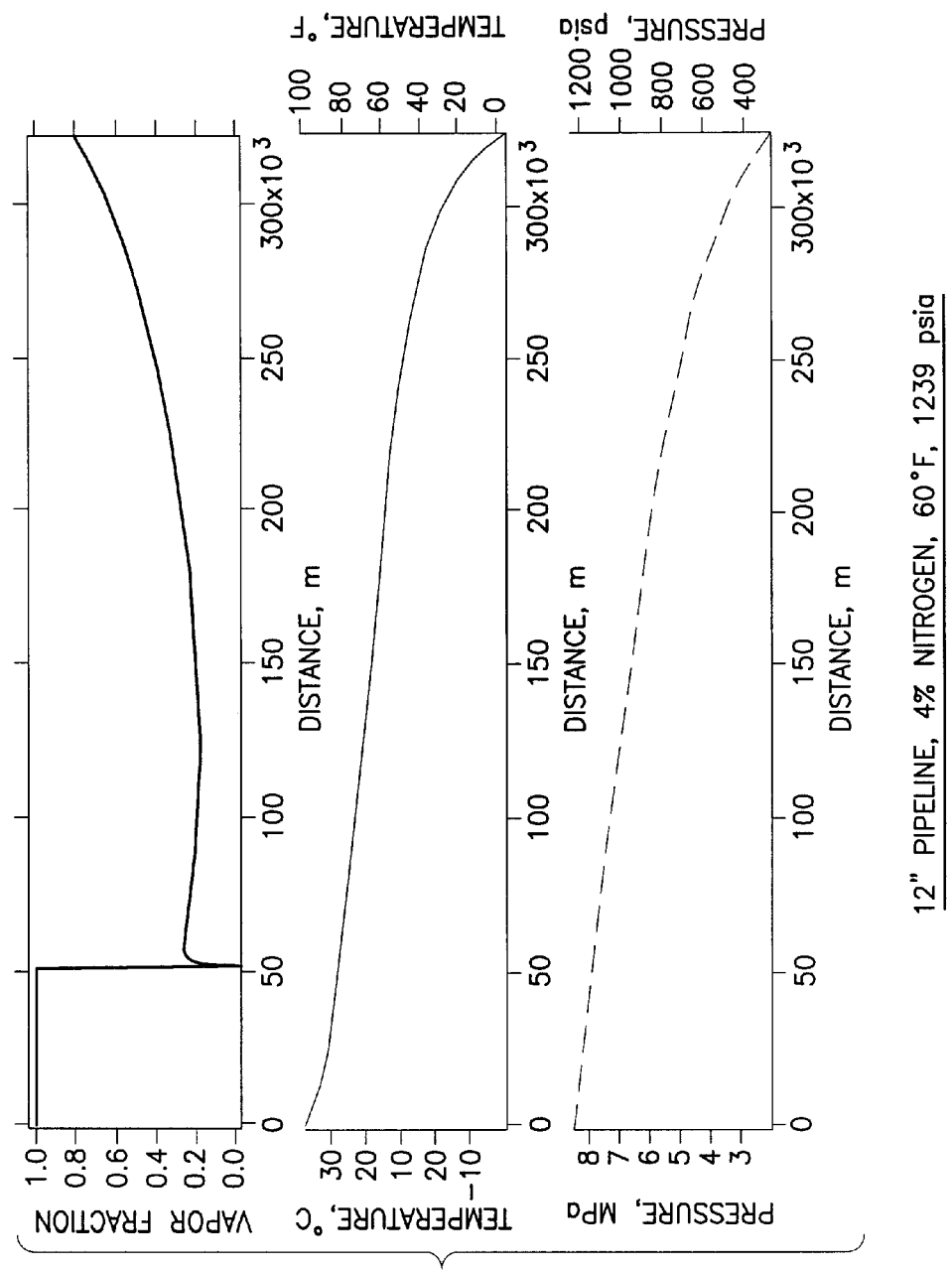
FIG. 12 represents P, T, and vapor fraction in a 12 inch pipeline for a fluid composition containing 4% nitrogen with operating pipeline inlet conditions at a temperature of 60° F. and a pressure of 1239 psia.

FIG. 12 depicts an identical arrangement to the arrangement of FIG. 6 except that instead of the pipeline containing 100% $CO_2$, it contains 96% $CO_2$ and 4% nitrogen, and the inlet pressure is set at 1239 psia (instead of 1200 psia). As indicated by the bottom graph, the pressure loss in this circumstance is very large (about 70% of the inlet pressure), and as indicated by the top graph, once the fluid passes the bubble point curve, there is two-phase flow along the entire pipeline.

In fact, at the outlet, approximately 80% of the fluid is in the vapor (gas) phase. Due to the latent heat of vaporization, the temperature of the fluid drops significantly below ambient to 0° F. Thus, extremely undesirable conditions are found at the pipeline output.

Figure 13:
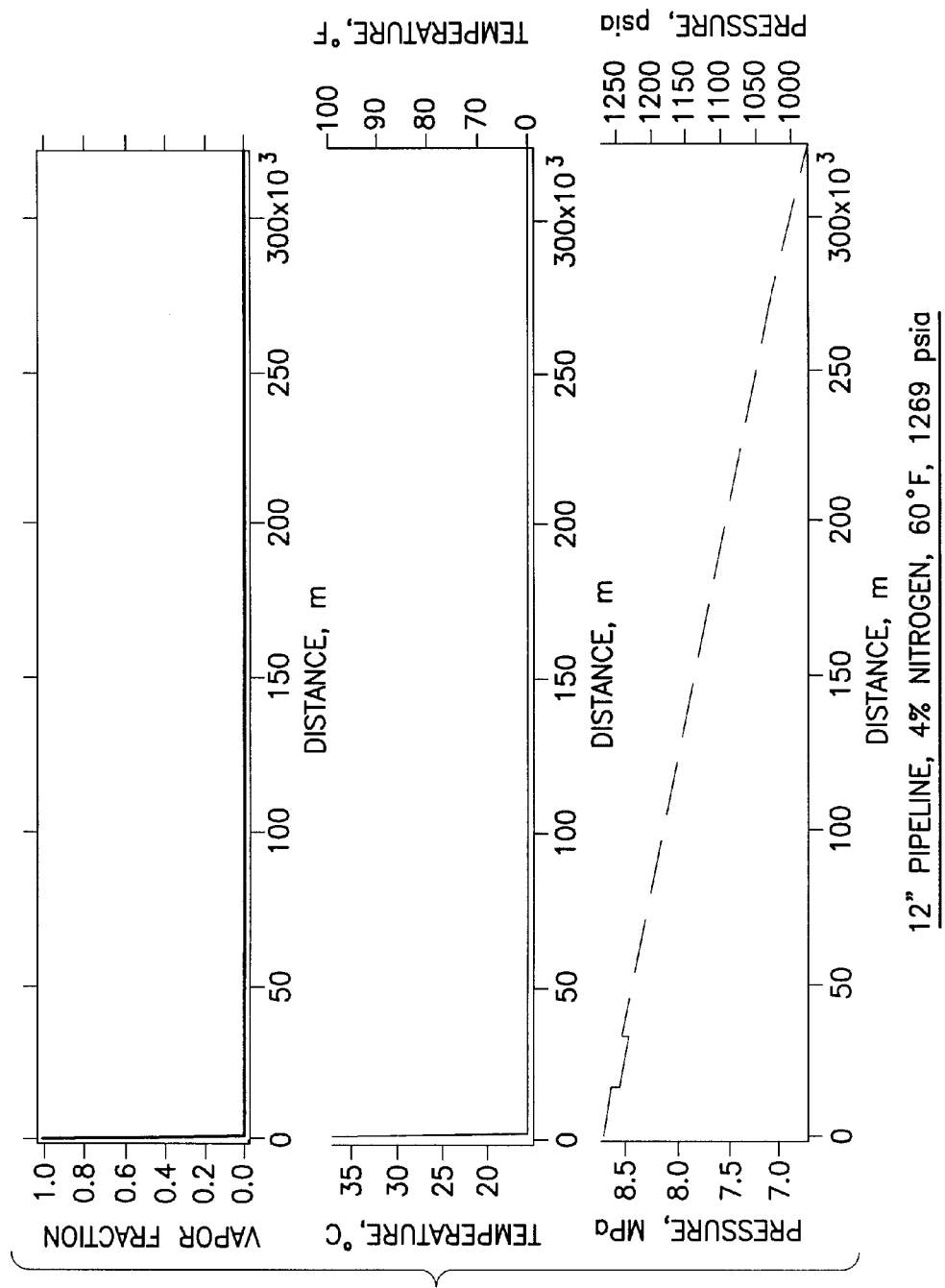
FIG. 13 represents P, T, and vapor fraction in a 12 inch pipeline for a fluid composition containing 4% nitrogen with operating pipeline inlet conditions at a temperature of 60° F. and a pressure of 1269 psia.

FIG. 13 depicts an identical arrangement to the arrangement of FIG. 12, except that the inlet pressure is increased to 1269 psia. As a result, as seen in the top graph, single-phase flow is maintained along the entire length of the pipeline. In addition, the pressure drop is reduced from about 70% to about 21% of the inlet pressure, and the temperature of the fluid never drops below ambient. Thus, by increasing the inlet pressure a small amount, efficiency is considerably improved, and desired outlet conditions are obtained.

The three components discussed above (oxygen, argon, and nitrogen), when added to carbon dioxide form mixtures that exhibit the Category I phase behavior for critical loci (see S. I. Sandler, 1999, Chemical and Engineering Thermodynamics John and Wiley & Sons. New York or P. H. Van Konynenburg; R. L. Scott, Critical Lines and Phase Equilibria in Binary van der Waals Mixtures, Philosophical Transactions of the Royal Society of London. Series A, Mathematical and Physical Sciences, Vol. 298, No. 1442 (Dec. 18, 1980), 495-540). For these mixtures, the critical pressures are higher than the carbon dioxide critical pressure and the critical temperatures of the mixtures are slightly lower than the critical temperature of carbon dioxide. However, other components when added to carbon dioxide may form mixtures that exhibit phase behaviors for critical loci defined by other Categories. In those cases, the temperatures and pressures of the mixtures in the pipeline will need to be likewise controlled based on their phase diagrams to avoid two-phase vapor/liquid flow or single-phase vapor flow in the pipeline. Thus, while the principles disclosed above are discussed for components that exhibit a Category I phase behavior for critical loci, the principles are just as applicable to other components that exhibit different phase behavior.

It also may be possible to identify components whose influence on the critical pressure and temperature of carbon dioxide-rich mixture is opposite to the three components discussed, i.e., addition of such a component decreases the critical pressure of the mixture. Thus, according to one aspect of the invention, such a component may be added to the effluent stream in lieu of or in addition to increasing the pressure and/or temperature of the effluent stream.

It should also be noted that, in non-reacting mixtures, to completely define the state of a mixture existing as a single phase, there are C+1 degrees of freedom (for a mixture with C components, where components are individual chemical species). Therefore, P, T and composition of the mixture need to be specified to completely define the system in a single phase. The composition of the mixture, specified by C-1 mole fractions, may be managed to ensure that the mixture stays in the supercritical or the liquid state. Changes in composition may be affected by either adding components, or selectively removing certain components from the mixture, or by blending different $CO_2$-rich streams.

It should be noted that carbon dioxide rich effluent gas stream are multicomponent mixtures. For these, the mixture critical properties and the phase envelopes may be experimentally determined or order to ensure that the mixture avoids the two-phase region or the vapor phase along the pipeline. Alternatively, the critical properties and phase envelopes of a multi-component mixture may be calculated based on equations of state (EOS).

More particularly, phase equilibrium for complex fluid mixtures may be calculated using equations of state developed from binary subsets of the more complex (i.e. >3 component) system. These equations of state frequently use binary interaction parameters which represent the effects of interactions between two molecules on the properties of the fluid. A simple example is the virial equation of state for single component fluid systems, e.g. EOSs of the form:

$$P/(\rho RT) = 1 + B(T)\rho + C(T)\rho^2 \quad (7)$$

where P is pressure, $\rho$ is molar fluid density, R is the gas constant, and T is temperature. The second virial coefficient B represents the averaged effects on the bulk fluid properties due to interactions between two particles (e.g. two $CO_2$ molecules). Likewise, the third virial coefficient C represents the averaged effects on the bulk fluid properties due to simultaneous three-body interactions (where the bodies are molecules or atoms). Higher order virial coefficients, in principle, represent sequentially higher numbers of simultaneous particle interactions which may be necessary to reproduce the properties of dense fluids (e.g. as density increases the probability of simultaneous interactions between larger numbers of particles increases). However, there are many more 2-body interactions than higher order interactions so the binary interaction terms are more significant. There are also some obvious spatial problems with simultaneous multibody interactions so models which use parameters which represent only binary interactions, and possibly ternary interactions, are advantageous for both physical and practical reasons.

The virial equation of state can be expanded to mixed fluid systems. Thus, for example B can be replaced by $B_{ij}$ where i=component 1 (e.g. $CO_2$), j=component 2 (e.g. Ar), and $B_{ij}$ is a compositionally weighted average of $B_i$ and $B_j$, e.g. $B_{ij} = X_i B_i + X_j B_j$, where $X_i$ and $X_j$ are the mole fractions of pure fluids i and j and $B_i$ and $B_j$ are the second virial coefficients obtained by separately fitting the virial EOS to the thermodynamic properties of fluids i and j. In this simple form, the virial EOS for the mixed ij system would be entirely predictive, e.g. no additional adjustable parameters would have been fit to properties for the mixed fluid. The previous example is an "ideal" mixture model. A more sophisticated model for systems which exhibit "non-ideal" properties for the mixture might incorporate a binary coefficient $B_{ij}'$ fit to properties of the fluid mixture ij. These "non-ideal" differences which often exist between the mixture model based on pure fluids and the measured mixture properties tend to be, but are not necessarily, small. For the case of a virial EOS which incorporates non-ideal mixing parameters the $B_{ij}$ might be expressed as: $B_{ij} = X_i B_i + X_i X_j B_{ij}' + X_j B_j$ For an EOS in which "non-ideal" binary mixture parameters have been fit for an arbitrarily complex chemical system (e.g. a mixture containing $N_2$, Ar, $CO_2$, $O_2$, $H_2O$; number of components, n=5) the number of non-ideal $B_{ij}$'s=n/(n−1)/2 (e.g. 10 $B_b$'s for a 5 member system). It is implicit that interactions ij are equivalent to interactions ji. Of course, there are also n binary interaction terms ($B_i$ and $B_j$) for the pure fluids. In addition, each B may be a function of temperature so the total number of adjustable parameters in an EOS can be much larger than number of B's.

The virial EOS roughly outlined above is only intended to depict a simple example. There are many different forms for equations of state for fluid mixtures, and all EOSs more sophisticated than the ideal gas law utilize, either implicitly or explicitly, binary interactions between the molecular components of the fluid. The more accurate models specifically recognize interactions between dissimilar components ij and some models recognize interactions between triplet interactions ijk (and possibly iij, ijj, jkk, . . . ). Higher order interaction terms representing simultaneous interactions between progressively larger numbers of particles have diminishing effects on the calculated bulk fluid properties and tend to introduce undue complexities in the mathematical formulations and consequently tend to be ignored. In general, EOSs which incorporate, implicitly or explicitly, only binary interactions tend to be more computationally efficient and are not necessarily less accurate than EOSs which incorporate higher order interactions.

The mathematical forms of EOSs in which binary or ternary interactions are incorporated within an EOS are highly variable but in all cases should be consistent with the ideal gas law (e.g. $P/(\rho RT)=1+B\rho+C\rho^2$ reduces to $P/(\rho RT)=1$ in the limit of zero density regardless of the forms of the higher order terms).

Cubic equations of state (e.g. Soave, Redlich-Kwong, or Peng-Robinson type variations of the van der Waals EOS) may be used to model industrial and natural gas systems because they are easy to solve and because their accuracies are sufficient for many applications. However, for near-critical systems (i.e., pressure-temperature conditions for a composition close to the critical point, where liquid and vapor become indistinguishable from each other), caloric modeling, or applications spanning very wide ranges of temperature and pressure (or density), cubic equations are not particularly accurate.

In contrast to cubic equations of state, Helmholtz free energy based equations such as the GERG-2004 (see O. Kunz et al., "The GERG-2004 Wide-Range Equation of State for Natural Gases and Other Mixtures", GERG TM15 2007; VDI Verlag GmbH, Publishing House of the Association of German Engineers, Dusseldorf 2007; ISBN 978-3-18-355706-6, which is hereby incorporated by reference herein in its entirety) can have very high levels of accuracy in all thermodynamic properties over very wide ranges of temperature and density. However, equations such as GERG-2004 are more complex than cubic EOSs and are computationally intensive.

The GERG-2004 EOS utilizes binary interaction terms in addition to the end-member component parameters. The GERG-2004 EOS was initially developed and tested for eighteen components of interest in the natural gas transportation, storage, and electrical power production industry (Ar, $CH_4$, $C_2H_6$, $C_3H_8$, CO, $CO_2$, $H_2$, $H_2O$, He, i-$C_4H_{10}$, n-$C_4H_{10}$, i-$C_5H_{12}$, n-$C_5H_{12}$, n-$C_6H_{14}$, n-$C_7H_{16}$, n-$C_8H_{18}$, $N_2$, $O_2$). One of the primary goals of the GERG-2004 project was to develop a wide-ranging EOS (large temperature and density range) with a minimum number of adjustable parameters. Consequently, the GERG-2004 EOS is designed in such a way that the parameters for the component pairs are grouped into "mixing-rule" classes that are effectively defined by the quantity and quality of thermodynamic data available for each component pair. Non-ideal mixing effects for most of the 153 component pairs in the original GERG-2004 are described using functions of reduced density and temperature (reducing functions) for each component that include only four adjustable parameters. More complex terms are appended to the non-ideality function for component pair systems which have data of sufficiently high accuracy to support use of the more complex mixing terms (specific and generalized departure functions). The 153 sets of binary interaction parameters were fit to selected data for each component pair system and then further refined using high quality data for ternary and quaternary mixtures. Fluid properties derived from models using the collection of parameters representing only binary interactions were then tested against data for a variety of multi-component mixtures (e.g. for n up to 10; see FIGS. 7.3-7.6 in GERG TM15 2007).

Figure 14:
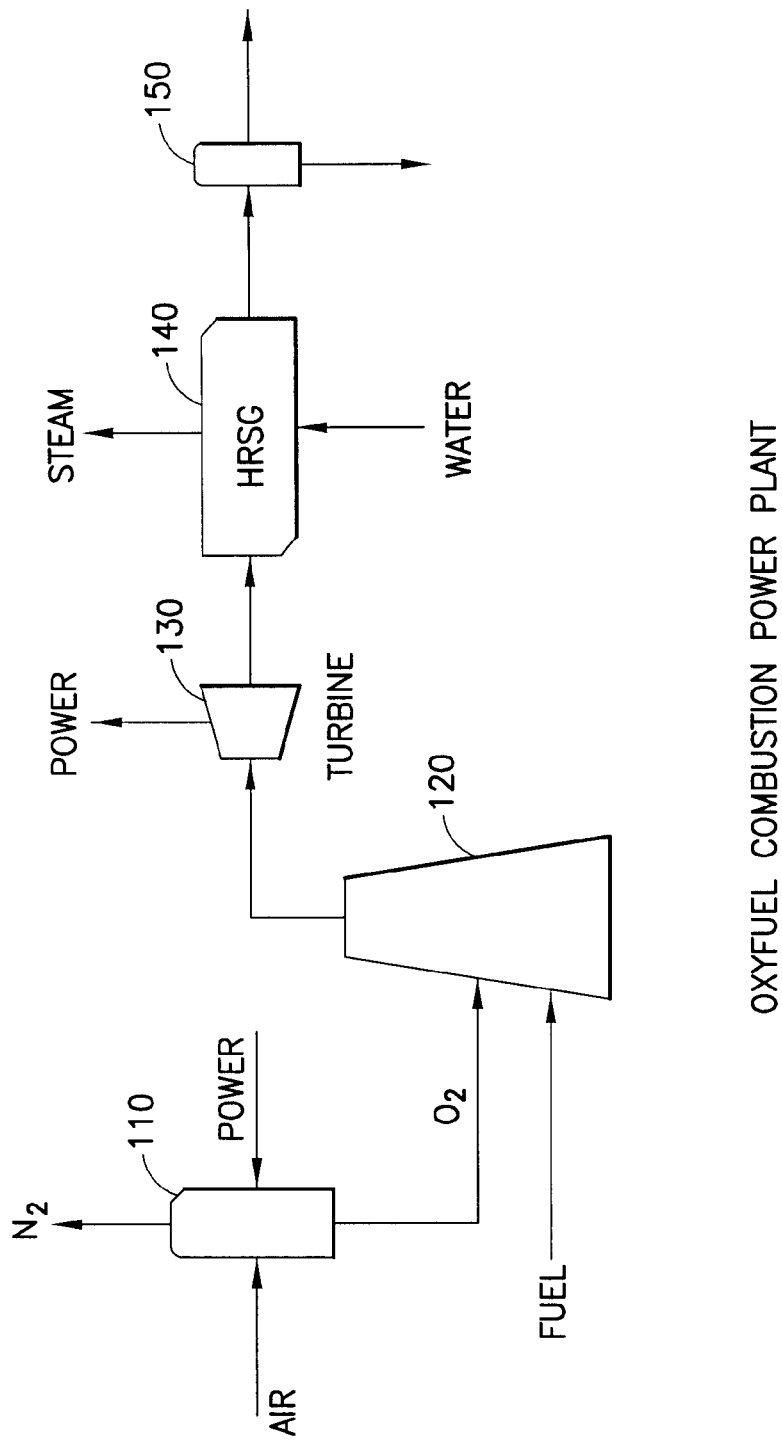
FIG. 14 is a schematic of a prior art oxygen fueled natural gas combined cycle power plant.

Turning now to FIG. 14, a prior art block diagram of an oxy-fuel natural gas combined cycle power plant is shown. Air is fed into a separator 110 which uses power to separate out the nitrogen and oxygen gases in the air. The oxygen is fed with natural gas fuel to a burner 120, and the combustion products (comprising mostly water in the form of steam and carbon dioxide) are fed to a turbine 130 which generates (electric) power. From the turbine, the effluent is preferably fed to a heat recovery steam generator 140 which takes in water and generates steam therefrom. The steam may be used as a cogeneration product, or to generate additional electricity by expansion across a turbine a process known as the combined cycle. Since generator 140 cools the effluent, water is removed from the effluent by a separator 150. The remaining effluent is primarily carbon dioxide. As previously discussed, depending upon the purity of the oxygen used in the burner 120, different effluent gas compositions will result (see Table 1 above). If desired the effluent may then be sent to a compressor as discussed hereinafter with reference to FIG. 15.

Figure 15:
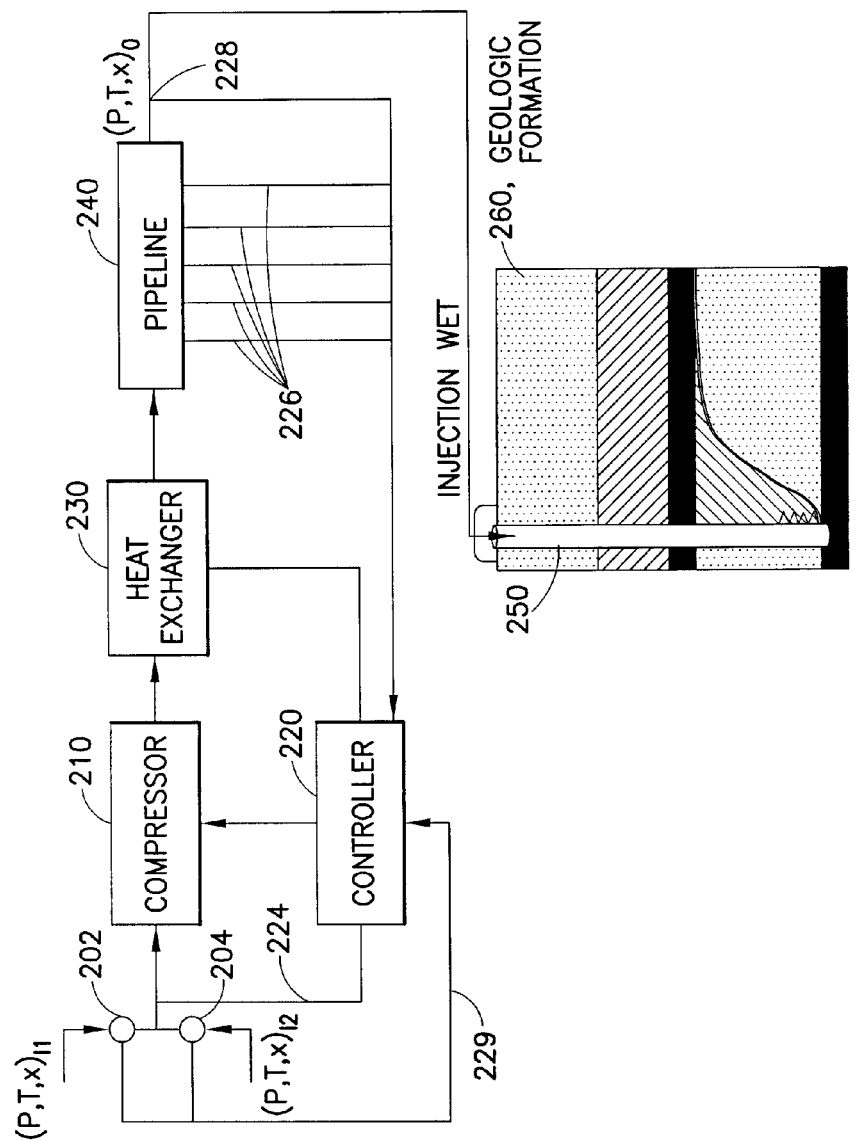
FIG. 15 represents schematic of surface facilities and pipeline according to one embodiment of the invention.

Regardless of the source of the effluent gas, if it is desired to pipe the effluent gas efficiently for injection into a geological formation (i.e., for sequestration), in accord with an aspect of the invention and as seen with reference to FIG. 15, one or more compressors 210, one or more heat exchangers 220, and a pipeline 230 should be engineered. As seen in FIG. 15, a first effluent stream is provided via a valve 202 to a compressor 210. If desired, and as discussed hereinafter, the first effluent stream may be combined with one or more additional effluent streams via valve 204 prior to being sent to the compressor 210. Compressor 210 may be a single compressor or a series of compressors (with or without intercoolers) which is/are controlled by controller 220 to compress the effluent stream to a desired pressure. The desired pressure may be determined as discussed in more detail below by the controller 220 which runs simulations and/or utilizes feedback information to determine the desired inlet pressure (and temperature) to the pipeline. As indicated in FIG. 15, after compression, one or more heat exchangers 230 (e.g., intercoolers or aftercoolers) are utilized such that the pipeline inlet conditions of $P_i$, $T_i$ and $x_i$ (mole fraction of the $i^{th}$ component) are specified based on compressor operation. After the temperature of the effluent is controlled, the effluent is fed into the pipeline 240 and from the pipeline may be injected directly or indirectly into an injection well 250 into a geologic formation 260 for sequestration. The pipeline 240 will have documented characteristics such as a diameter D, a roughness rating, a length, elevational changes, insulation, etc., and will be subject to ambient (ground and/or air) conditions which are generally known or measureable. For purposes herein, the "outlet" of the pipeline at or adjacent the injection well, may be directly connected to the injection well, or may be coupled to the injection well via additional equipment such as pumps, compressors, etc.

According to one aspect of the invention, the controller 220 may run a simulation of the pipeline in order to set the operating inlet pressure and temperature. Simulators such as HYSYS (trademark of Aspentech) or PIPESIM (trademark of Schlumberger), or specialized in-house models may be utilized for this purpose. Suitable pressure drop correlations and appropriate EOSs are preferably utilized as inputs to the simulator. Both available experimental data and a suitable EOS can be used to generate the multi-component phase diagram for the effluent gas mixture. It should be appreciated that the phase diagram can be shown equivalently in terms of different variables, e.g., the (P,T) domain (shown in FIG. 1), the (T,S) (temperature, entropy) domain, or the (P,H) (pressure, enthalpy) domain.

The phase diagram information for the simulator may be obtained either by taking a sample of the effluent stream and subjecting the sample to phase analysis extensive testing (e.g., by changing the temperature and pressure over desired ranges), or by running a compositional analysis on the effluent stream at 224 and generating a phase diagram equations of state as previously discussed. If a compositional analysis is utilized at 224, the compositional analysis may be conducted in real-time using one or more gas analyzers such as a Teledyne or Servomex analyzers which preferably determine the mole percentages of at least the carbon dioxide, nitrogen, oxygen, argon, and water in the effluent stream.

The pressure drop correlation information for the pipeline may be obtained using the Beggs and Brill pressure drop correlations into which the known characteristics of the pipeline are input. In addition, based on the flow regime encountered in the pipeline (such as multiphase flow, laminar or turbulent flow), other pressure drop correlations may be more suitable and may be utilized. E.g., the options in HYSYS include: HTFS with slip, HTFS homogeneous flow, Poettman and Carpenter, Baxendell and Thomas, Duns and Ros, Hagedorn and Brown, Orkiszewski, Aziz, Govier and Fogarasi and Tulsa 99. Another option, OLGAS, is also available as a gradient method.

It will be appreciated that the simulator may use the mass, energy, and momentum balance equations, and equations of state (which are available from a thermodynamic package such as NIST REFPROP) in order to generate, e.g., pressure, temperature, and vapor fraction calculated along the length of the pipeline (such as shown in FIGS. 5-13). If the profiles generated indicate or exhibit undesirable qualities (e.g., two-phase flow somewhere along the pipeline), the controller 220 can run one or more additional simulations to find a desired pressure-temperature inlet combination that will provide (according to the simulator) a single-phase liquid or supercritical state throughout the pipeline. Upon finding the desired pressure and temperature values, the controller 220 can adjust the inlet compression and/or temperature by controlling the compressor(s) 210 and/or the heat exchanger 230. If desired, the pressure at the pipeline input can be controlled to be between 0% and 30% above the pressure which is determined to be the minimum pressure required to maintain a liquid or supercritical phase stream flow throughout the pipeline.

To account for inaccuracies in thermodynamic models, fine-tuning of the inlet conditions to the pipeline can be carried out in real time in a feedback control scheme. Thus, a two-phase detection device (not shown) can be installed at the outlet 228 of the pipeline and at various points along the pipeline. This device could utilize sensors that make, e.g., one or more of optical, acoustic, absolute and/or differential pressure, and temperature measurements. The two-phase detection device determines the presence or absence of a two-phase flow at the outlet or at intermediate points in the pipeline. If two-phase flow is sensed, that information is fed back to the controller 220 which causes the compressor 210 and/or the heat exchanger 230 to adjust (or increase) the inlet pressure and/or adjust (or reduce) the temperature to eliminate the two-phase region. If two-phase flow is not found, the two-phase detection device could feed that information back to the controller 220 which could cause the compressor 210 and/or the heat exchanger 230 to adjust (decrease) the pressure and/or (increase) the temperature and thereby reduce power consumption until the two-phase region is approached. If two-phase flow is then detected, the controller 220 will cause an increase in pressure and/or a decrease in the temperature until the system is working just above the bubble-point line. It will also be appreciated that rather than or in addition to modifying the pressure and/or temperature, in certain circumstances, the fluid composition may also be used by the controller at 229 as a manipulated variable. Adding components that decrease the mixture critical pressure helps in changing the flow regime from a two-phase region to a single-phase region. This is suitable when multiple gas feed streams are available. In contrast, if a particular effluent stream is in single-phase flow, components of another effluent stream may be blended into that stream (e.g., by having controller 220 control valves 202, 204) that raise the critical pressure, until the two-phase region is approached (even though the mixture stays in the single phase region).

According to one aspect of the invention, a measured pressure and/or temperature profile along the pipeline can be used to adjust the inlet P, T and composition to keep the pressure drop within limits by avoiding the two-phase region.

According to one aspect of the invention, during operation, conditions may change at the compressor outlet, or pipeline inlet based on changes in fluid composition. For example, if the carbon dioxide purity decreases and the mole fraction of one or more of argon, nitrogen or oxygen increases in the gas stream, based on the amount of increase, the outlet pressure from the compressor may need to be increased in order to maintain single-phase flow throughout the pipeline. Alternatively, if the mole fraction of carbon dioxide increases in the presence of these gases, then the outlet pressure may be lowered for reduced power utilization. If gas analyzers are utilized to sense the change in conditions in real-time, and the new information is automatically input into the simulator of the controller 220, the controller can automatically run a new simulation, identify new pressure and temperature values for the pipeline inlet which will cause single-phase flow to be maintained throughout the pipeline, and cause the compressor 210 and/or heat exchanger 230 to treat the effluent accordingly.

According to another aspect of the invention, it is desirable to minimize the cost associated with transporting a mostly-$CO_2$ effluent for sequestration (for purposes herein the term "mostly-$CO_2$ effluent" is to be understood as an effluent containing at least 50% carbon dioxide). Thus, it is generally desirable to maintain the effluent pressure and temperature at a point just above the bubble point line. As previously described, this may be accomplished by running a simulation which is used in setting the inlet pressure and temperature to desired values that will provide a single-phase liquid or supercritical flow throughout the pipeline. Alternatively, this may be accomplished by a feedback control scheme where the state of the effluent is sensed by one or more sensors along the pipeline and preferably at the outlet of the pipeline as well. The sensors could utilize one or more of optical, acoustic, differential pressure, and temperature measurements. Basically, the sensors would determine the presence or absence of a two-phase flow at the outlet 228 or at intermediate points 226 in the pipeline. If sensors are used along the pipeline (e.g., every mile), one or more additional compressors and/or heat exchangers (not shown) may be utilized along the length of the pipeline to boost the pressure (or decrease the temperature) if a determination is made that the effluent is in a two-phase flow. In this manner, the effluent stream may be caused to "bump" along above or at the bubble point curve for the effluent all along the pipeline rather than being initially compressed to a pressure in excess of what is required along most of the pipeline. The addition of the sensors and the additional compressors and/or heat exchangers would ensure minimum power consumption.

According to a further aspect of the invention, the controller 220 may be a simple controller that utilizes feedback information and does not run simulations. More particularly, given a mostly-$CO_2$ effluent of relatively known content, the controller is provided with a set of default values for the pressure and temperature of the effluent at the inlet to the pipeline. Alternatively, a look-up table for different effluents and resulting starting pressure and temperature values could be provided. Feedback to the controller is provided by one or more sensors along the pipeline and/or at the outlet of the pipeline. If two-phase flow is sensed, that information is fed back to the controller 220 which causes the compressor 210 and/or the heat exchanger 230 to adjust (increase) the inlet pressure and/or (decrease) temperature to eliminate the two-phase region. If two-phase flow is not found, the two-phase detection device could feed that information back to the controller 220 which could cause the compressor 210 and/or the heat exchanger 230 to adjust (decrease) the pressure and/or (increase) temperature and thereby reduce compressor and/or heat exchanger power consumption until the two-phase region is approached. If two-phase flow is then detected, the controller 220 will cause an increase in pressure and/or decrease in temperature until the system is working just above the bubble-point line.

In all cases using feedback from the pipeline, the control system allows an experimental determination of the two-phase boundary for the flow regime and the ability to operate close to the two-phase boundary, thereby optimizing the system to reduce power consumption. In practice, an operator of the pipeline may choose a safety factor and operate a certain percentage ($\epsilon\%$) from the two-phase envelope in the preferred liquid or the supercritical region.

This optimization may be extended to a pipeline network. Consider a general pipeline network with m pipelines and h hubs (defined as a point where the pipeline pressure, temperature, dimensions or contained fluid composition may be changed). Each section between hubs is then examined as discussed in one of the previously described embodiments to design the pipeline segment. Initial operating conditions are calculated based on fluid composition, as discussed above. A finer feedback control system, as previously described, may then be used to further optimize the power consumption, and finally the entire pipeline may be operated with the safety factor of $\epsilon\%$ above the two-phase boundary of the individual pipeline segments.

$G_1$ is a cost function that estimates the contribution of amortized capital cost and operating cost for one or more compressors and other surface facilities (including e.g., gas analyzers, sensors, etc.) if any. $G_2$ is a cost function that includes contributions for amortized cost and operating costs of the pipeline. For a larger compressor (or a compressor with a higher operating or installed power), the functional value is higher. Similarly, the functional value for $G_2$ is a function of the pipeline diameter, all other variables such as the material specifications, etc. being equal. For an optimal solution, the sum of $G_1$ and $G_2$ can be minimized according to techniques well known in the art.

Multiple embodiments of the present invention have been described. Nevertheless, it will be understood that various modifications may be made without departing from the spirit and scope of the invention. For example, embodiments of the invention as disclosed above have many further applications in both surface and subterranean environments. Also, while the effluent gas was described primarily with respect to being the by-product of a power plant, it will be appreciated that the effluent gas might be a by-product of other sources. It is noted that the foregoing examples have been provided merely for the purpose of explanation and are in no way to be construed as limiting of the present invention. While the present invention has been described with reference to an exemplary embodiment, it is understood that the words, which have been used herein, are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method of controlling a mostly-CO2 effluent stream in a pipeline, comprising:
using at least at sensor to sense a state of said mostly-CO2 effluent stream along or at an outlet of said pipeline, and feeding an indication of said state back to a controller; and
using the controller to control at least one of operating pressure and temperature of the mostly-CO2 effluent stream in order to (i) maintain said effluent stream as a single-phase liquid or a supercritical fluid stream in the pipeline using said indication of said state of said mostly-CO2 effluent stream and (ii) cause said mostly-CO2 effluent stream to move closer to a bubble-point line, while maintaining said mostly-CO2 effluent stream as the single-phase liquid or the supercritical fluid stream, when said indication of said state of said mostly-CO2 effluent stream indicates single-phase flow.

2. A method according to claim 1, wherein:
said controlling comprises generating a phase analysis of the mostly-CO2 effluent stream, and running a simulation of the pipeline using known characteristics of the pipeline and the phase analysis in order to set operating inlet pressure and temperature criteria for said mostly-CO2 effluent stream.

3. A method according to claim 2, wherein.
said phase analysis is a pressure-temperature phase diagram computation.

4. A method according to claim 2, wherein:
said generating a phase analysis comprises obtaining a sample of said mostly-CO2 effluent stream and analyzing said sample in a laboratory.

5. A method according to claim 2, wherein:
said generating, a phase analysis comprises conducting a compositional analysis of said mostly-CO2 effluent stream utilizing at least one gas analyzer and generating said phase analysis based on aid compositional analysis.

6. A method according to claim 5, wherein:
said generating a phase analysis comprises generating a phase diagram based on said compositional analysis by utilizing equations of state.

7. A method according to claim 6, wherein
said equations of state are based on one of Helmholtz free energy, cubic equations of state, and virial equations of state.

8. A method according to claim 2, wherein:
said known characteristics of said pipeline comprise at least a diameter of said pipeline, a roughness rating for said pipeline, a length of said pipeline, and ambient conditions associated with said pipeline.

9. A method according to claim 1, wherein:
if said indication of said state of said mostly-CO2 effluent stream indicates two-phase flow, adjusting at least one of said operating press and temperature to cause said mostly-CO2 effluent stream to return o single-phase flow.

10. A method according to claim 9, wherein:
said adjusting comprises increasing said operating pressure at an inlet to said pipeline.

11. A method according to claim 9, wherein:
said adjusting comprises decreasing said operating temperature at an inlet to said pipeline.

12. A method according to claim 9, wherein:
said adjusting comprises at least one of increasing said operating pressure and decreasing said operating temperature at a location along the pipeline other than at an inlet of said pipeline.

13. A method according to claim 1, wherein:
said at least one sensor comprises at least one sensor at said pipeline outlet.

14. A method according, to claim 1, wherein:
said at least one sensor comprises a plurality of sensors at a plurality of ocations along said pipeline.

15. A method according to claim 1, wherein:
depending upon said indication of said state of said mostly-CO2 effluent stream, adjusting a compositional make-up of said mostly-CO2 effluent stream.

* * * * *